US005491754A

United States Patent [19]

Jot et al.

[11] Patent Number: 5,491,754

[45] Date of Patent: Feb. 13, 1996

[54] METHOD AND SYSTEM FOR ARTIFICIAL SPATIALISATION OF DIGITAL AUDIO SIGNALS

[75] Inventors: Jean-Marc Jot, Paris; Antoine Chaigne, Buc, both of France

[73] Assignee: France Telecom, Paris, France

[21] Appl. No.: 19,846

[22] Filed: Feb. 19, 1993

[30] Foreign Application Priority Data

Mar. 3, 1992 [FR] France .................................. 92 02528

[51] Int. Cl.[6] ........................................ H03G 3/00

[52] U.S. Cl. ........................................ 381/63; 84/630

[58] Field of Search .......................... 381/61, 63; 84/630, 84/707, DIG. 26

[56] References Cited

U.S. PATENT DOCUMENTS 4,218,585 8/1980 Carver .
4,731,835 3/1988 Futamase et al. ........................ 381/63
4,803,731 2/1989 Niimi et al. .............................. 381/63

FOREIGN PATENT DOCUMENTS 8501177 3/1985 WIPO .

OTHER PUBLICATIONS

"Designing Multi-Channel Reverberators" by John Stautner and Miller Puckette, in Computer Music Journal, pp. 52–65.

Computer Music Journal, vol. 3, No. 2, 1979, Menlo Park, US pp. 13–28, J. Moorer, "About this reverberation business".

90th Audio Engineering Society Convention, Preprint 3030, Feb. 1991, New York, U.S., J–M Jot et al. "Digital delay networks for designing artificial reverberators".

*Primary Examiner*—Curtis Kuntz
*Assistant Examiner*—Ping W. Lee
*Attorney, Agent, or Firm*—Larson and Taylor

[57] ABSTRACT

A method and a system for artificial spatialization of audio-digital signals x(k) making it possible to effect on elementary signals xi(k), replicas of the audio-digital signal, different delays creating delayed elementary signals (seri) summed after weighting with the signal x(k) in order to create the spatialized audio-digital signal y(k). A plurality of linear combinations of the signals (seri) as combined delayed elementary signals (serci) is summed with the elementary signals xi(k). So as to simulate a late reverberation, the linear combinations are effected by a unit loopback, and an attenuation hi(ω), a decaying monotonic function of the reverberation time Tr(ω) to be simulated and proportional to the delay, is effected with each delay. A spectral correction before weighted summation satisfying the relation:

$$|t(e^{j\omega})|^2 = \frac{\Sigma\tau i}{Tr(\omega)}$$

is effected, τi designating the value of each delay, increased by the phase delay due to the attenuation.

14 Claims, 12 Drawing Sheets

FIG. 1c.
(PRIOR ART)
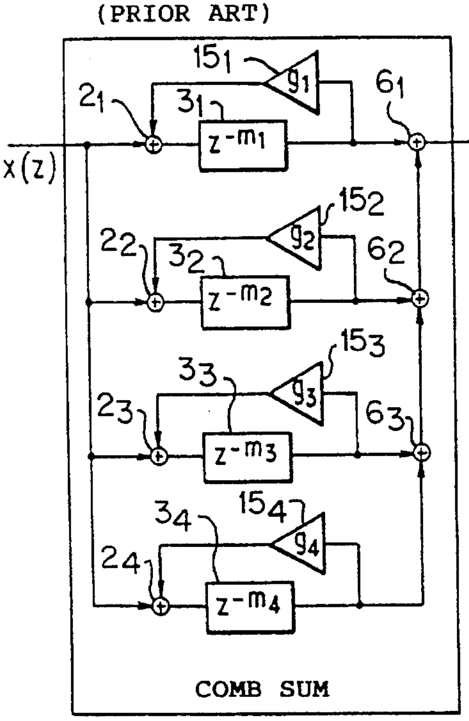
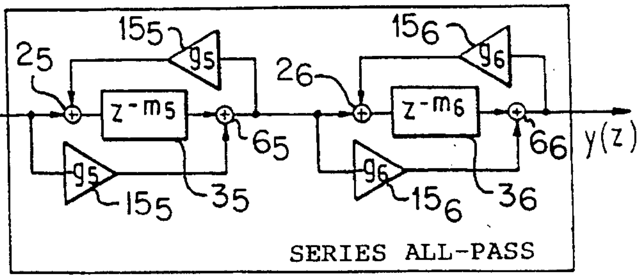
FIG. 1d.
(PRIOR ART)
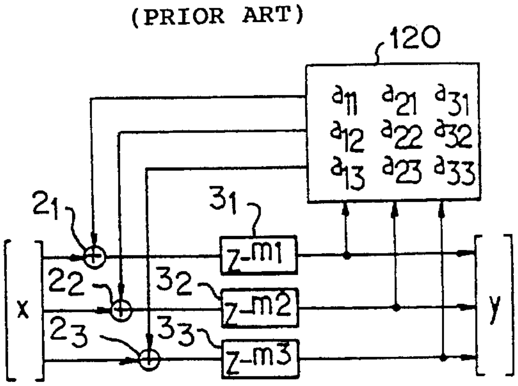
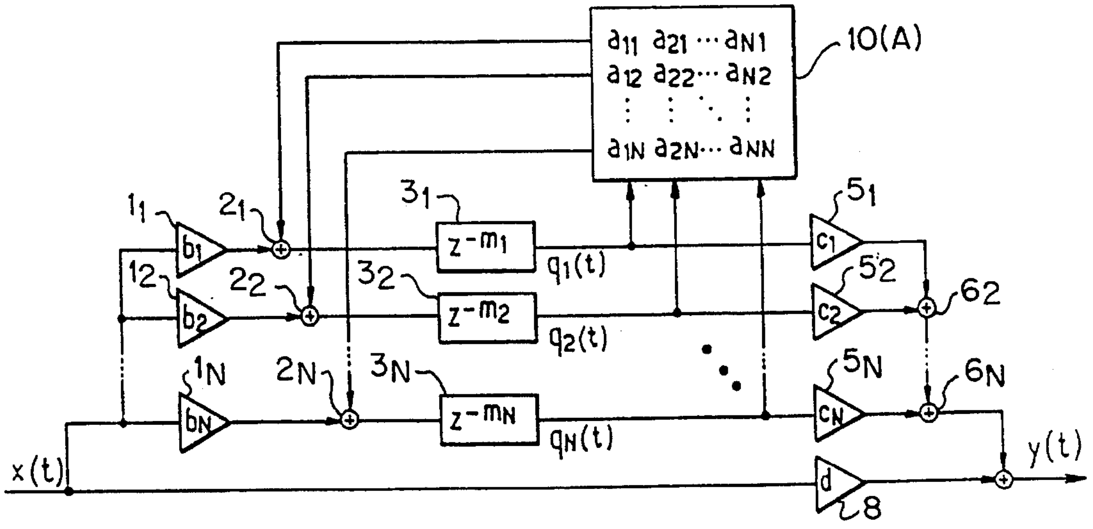
FIG. 1e.
REFERENCE FILTER (PRIOR ART)

FIG.3a.
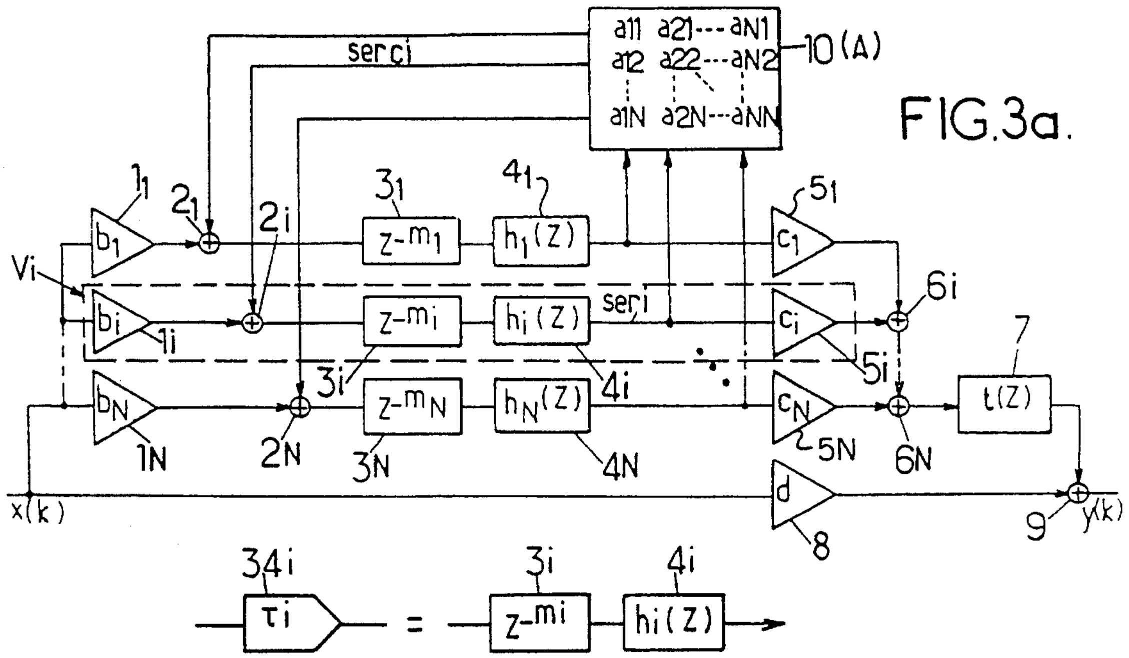
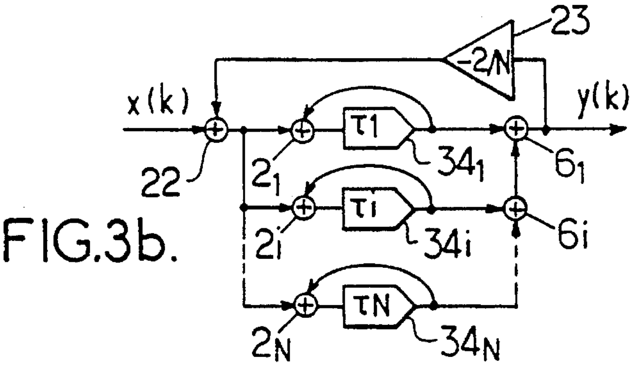
FIG.3b.
FIG.3c.
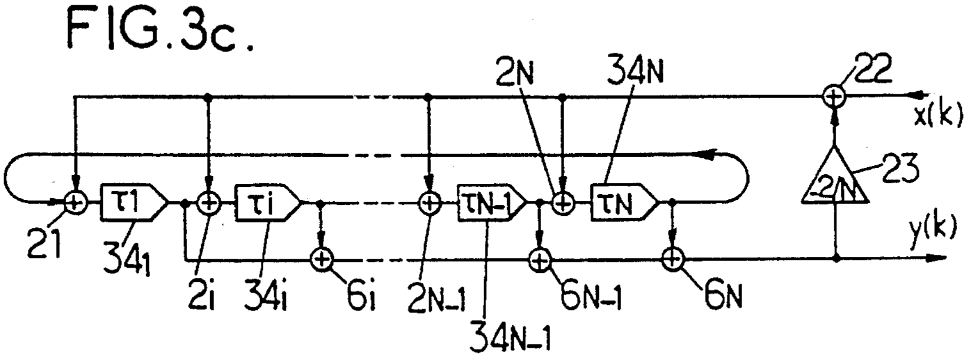

FIG.5c.
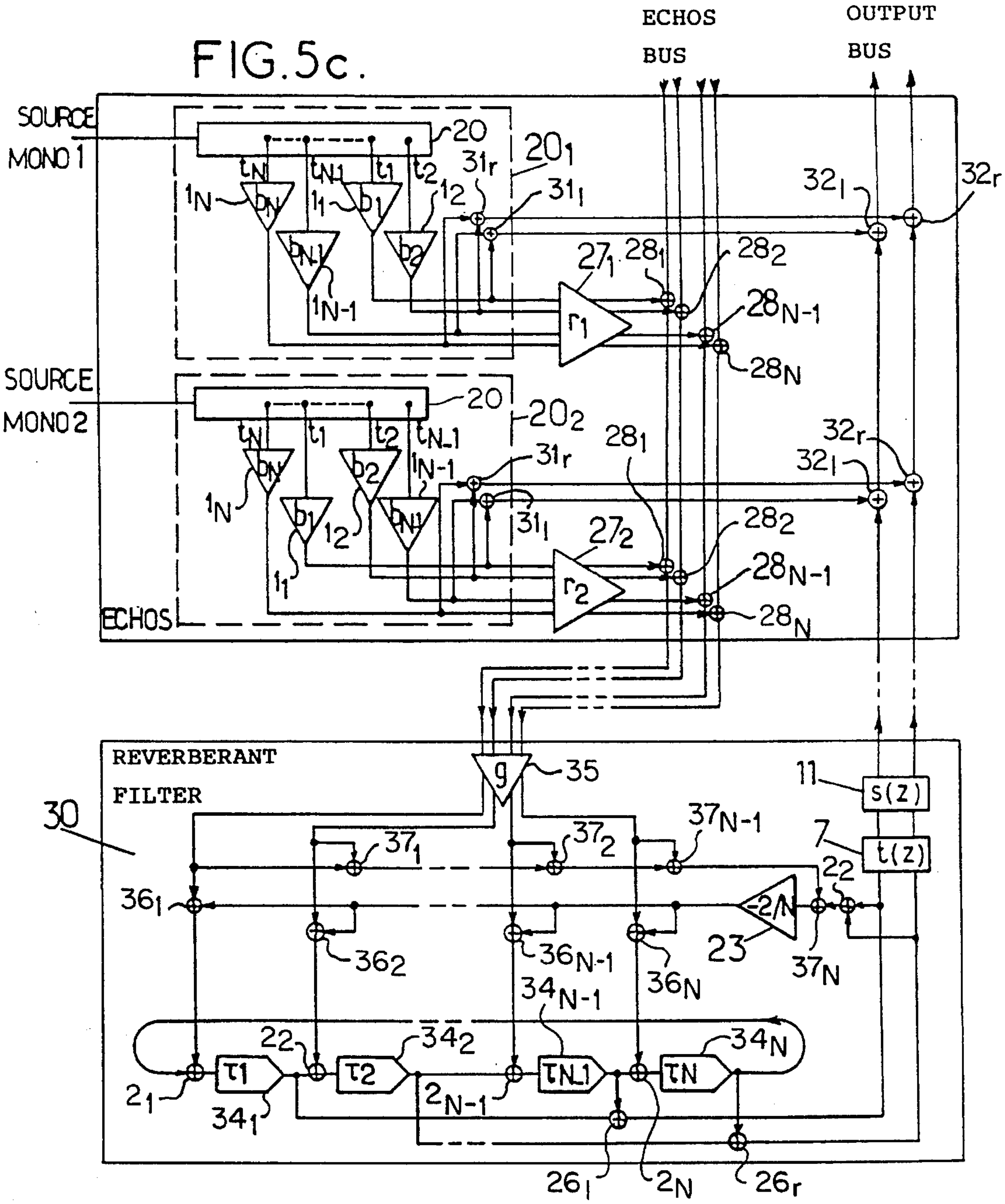
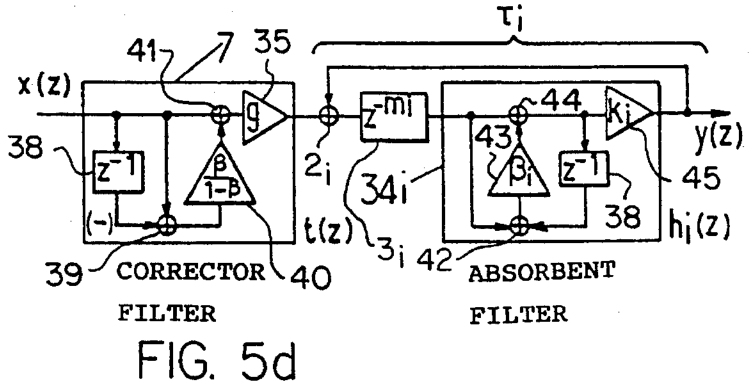
FIG. 5d
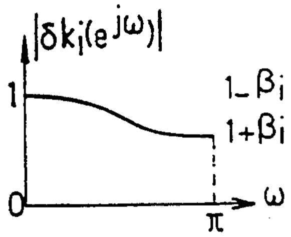
FIG. 5e

METHOD AND SYSTEM FOR ARTIFICIAL SPATIALISATION OF DIGITAL AUDIO SIGNALS

The present invention relates to a method and a system for artificial spatialisation of digital audio signals. Artificial reverberators are used in the music and cinema industry, in order to superimpose a room effect on the recordings produced in the studio, or even so as to modify the acoustic properties of an auditorium.

BACKGROUND OF THE INVENTION

A recent report compiled by A. DECOVILLE published by the Ecole Nationale des Télécommunications, 46 rue Barrault, Paris, Report no. 90 SIG 005, 1990, showed that as far as the industrial production of reverberators is concerned, special effects generators, without particular reference to the acoustics of a room or to the auditory perception of the space, can be distinguished from reverberator systems proper which are aimed at convincingly reproducing the acoustics of one or a type of room and whose adjustment parameters are related to the physical characteristics of enclosed sites.

As far as reverberators proper are concerned, the response to an impulse sound excitation of an auditorium shows that, as is represented in FIG. 1*a*, the typical echogram comprises the direct sound followed by the first echoes or temporally early echoes which can be registered by the ear, then finally a continuum perceived on the contrary as a sound trail. This sound trail, termed late reverberation, is characteristic of the auditorium itself, since it is, to a first approximation, independent of the relative positions and of the spread of the sources and listeners, this not being the case for the first echoes.

Conventionally, since a realistic simulation of the space effect must encompass the first echoes and the late reverberation, a reverberator usually includes, as is represented in FIGS. 1*b*, a FIR filter (finite impulse response digital filter) 102 simulating the first echoes, and a reverberant filter 104, formed by a recursive network of digital delays and capable of reproducing the characteristic properties of the late reverberation. The reverberator shown in FIG. 16 also includes amplifiers 106, 108, 110 and adder 112.

More precisely, the elementary basic structures of the majority of commercial reverberators consist in the use of filters, so-called comb filters and all-pass filters. These filters are widely known in the state of the art. The comb filter has a disadvantage, in the frequency domain, arising from the periodicities of its spectral response causing a colouration perceived as a metallic timbre. The same is true for the all-pass filter when the input signal is not stationary, as in the case of speech signals and music.

The two aforesaid filters have furthermore the disadvantage, in the time domain, of exhibiting a low density of echoes of their impulse response, thus engendering the phenomenon known as flutter in the transients.

So as to eliminate the colouration phenomenon and increase the density of echoes, M. R. SCHROEDER proposed using in cascade a parallel association of comb filters, termed a comb sum, and a series association of all-pass filters, as is represented in FIGS. 1*c*, compare the publication "Natural sounding artificial reverberation", J. Audio.Eng.Soc. 10(3):219–223, 1962. For a comb filter, the reverberation time Tr is given by the relation:

$$\frac{20 \cdot \log_{10}(gi)}{mi \cdot T} = \frac{-60}{Tr}$$

where, for a cell of rank i, gi designates the loop gain of rank i, mi the duration of delays, expressed as an integer number of sampling periods T.

For a comb sum, the assigning to each comb of the same reverberation time Tr entails a choice of the loop gain gi related to the duration of the delay mi.

Such a choice implies that, for each cell of rank i, $\gamma = gi^{1/mi}$, $\gamma$ designating the corresponding modulus of the poles.

Compare the publication by J.M.JOT and A.CHAIGNE "Digital delay networks for designing artificial reverberators", Proc. 90th A.E.S. Convention, Paris 1991, preprint 3030(E-2) hereafter designated [JOT, CHAIGNE, 91]. The interpretation of the aforesaid conditions, so that no particular mode is audible during the late reverberation, which would correspond to an undesired colouration, is therefore that all the resonant modes of the reverberant filter must possess the same attenuation time constant. For N comb filters in parallel, the modal density, the number of resonant modes per Hz, can be written:

$$Df = \sum_{i=0}^{N-1} \tau i = N \cdot \tau$$

$\tau i$ being the duration of the delay of the cell of rank i in seconds, and the echo density compare [JOT, CHAIGNE, 91]

$$Dt = \sum_{i=0}^{N-1} \frac{1}{\tau i} \approx \frac{N}{\tau}$$

For sufficiently similar durations $\tau i$, the number N of comb filters can be written:

$$N = \sqrt{Df\,Dt}\ .$$

In order to retain a reasonable number N of elementary cells M. R. SCHROEDER proposed associating a series all-pass filter in cascade with the comb sum. The all-pass filter enables the density of echoes to be increased without noticeably modifying the timbre of the reverberation, defined by the comb filters associated in parallel.

Although such a solution makes it possible to determine, overall, the reverberation time, it does not enable the resonances of the all-pass filters to be taken into account. Further, no study has made it possible to show how to avoid the defects of sonority of the series all-pass filter and to determine the number of all-pass cells, their delay or loop gain values in order to obtain a given density of echoes. Thus, the choice of the parameters of the all-pass filters remains essentially empirical.

In actual auditoria, the physical phenomena of sound absorption mean that the damping of the sound waves depends on frequency. The reverberator such as represented in FIGS. 1*c* formed the subject of an adaptation by the replacing of each loop gain gi by an IIR, infinite impulse response filter, low-pass filter, so as to simulate the absorption of sound in air. Compare J. A. MOORER "About this reverberation business", Computer Music Journal 3(2):13–18, 1979.

Such a method makes it possible neither to take into account the absorption of sound by the walls of the room, the absorption due to air usually being negligible, neither to control, in calculating the coefficients of the filters, the variation in reverberation time as a function of frequency. This technique also entails the interdependence of the adjustments in the reverberation time and the energy of the reverberated signal as a function of frequency. This problem is unsolved for the comb sum structure of FIGS. 1*c*.

Another approach making it possible to multiply the number of echoes in the response of the reverberant filter, the multi-channel approach, has been proposed. The latter, consisting in appending loopback channels linking the various delays, makes it possible progressively to increase the density of echoes in the impulse response, as in the case of actual rooms.

STAUTNER and PUCKETTE, in the article "Designing multi-channel reverberators", Computer Music Journal 6(1), 1982, have proposed the structure represented in FIGS. 1*d*. These authors, limiting themselves to studying the stability of the aforesaid structure, propose however a particular 4-channel embodiment using a loopback transfer matrix of the form $$A = \frac{g}{\sqrt{2}} \begin{bmatrix} 0 & 1 & 1 & 0 \\ -1 & 0 & 0 & -1 \\ 1 & 0 & 0 & -1 \\ 0 & 1 & -1 & 0 \end{bmatrix} \text{ with } g < 1$$

In this embodiment, the echo density is not a maximum, by reason of the nullity of some transfer coefficients of delay elements 3*i*, and the use of the gain parameter g of multiplier elements 15*i* alone to control the reverberation time amounts to assigning an identical attenuation to every delay, without taking their durations into account. Furthermore, just as in the case of the comb sum filter, corresponding to the case where the matrix A is diagonal, this choice involves the risk that all the resonant modes do not have an identical decay time, thus not guaranteeing the absence of colouration of the transients.

More recently, a general model, such as represented in FIGS. 1*e*, has been proposed, compare [JOT, CHAIGNE, 91 ]. This model essentially comprises a reference filter consisting in fact of a reverberant filter all of whose poles have unit modulus, an infinite reverberation time thus being obtained at every frequency. Such a situation obtains if the loopback matrix 120 is a unit matrix when the delays are free of attenuation. The main subject of the previously cited article [JOT, CHAIGNE, 91 ] is the study of the conditions for obtaining the aforesaid constraints in respect of the reference filter, the introduction of attenuations having been envisaged, in this article, at the very most for the purpose of controlling the reverberation time of comb filters.

SUMMARY OF THE INVENTION

On the contrary, the subject of the present invention is a method and a system for artificial spatial processing of a digital audio signal making it possible to vary the simulated reverberation time, as a function of the frequency of the sound signal, whilst complying with the constraint of identical modulus for all the poles for the reference filter.

Another subject of the present invention is furthermore a method and a system for artificial spatial processing of a digital audio signal making it possible at one and the same time to fulfil criteria of modal density in the spectral domain and of temporal density of echoes.

Another subject of the present invention, the preceding subject being fulfilled, is to allow, both at the level of the method and of the system for artificial spatial processing which is the subject of the present invention, separate control of the reverberation time, of the spectral envelope of the response of the simulated auditorium and of the modal density, evincing in fact the size of the simulated auditorium.

Another subject of the present invention is also a method and a system for artificial spatial processing of a digital audio signal making it possible to control the instants of arrival and the amplitudes of the early echoes whilst preserving the timbre of the late reverberation, through the absence of any risk of introducing colouration of the reverberated signal.

Another subject of the present invention is also a method and a system for artificial spatial processing of a digital audio signal allowing control of the clarity, defined as the ratio of the energy of the early echoes to that of the late reverberation.

Another subject of the present invention is also a method and a system for artificial spatial processing of a digital audio signal both mono- and stereophonic, allowing in the latter case control of the direction of origins of the early echoes.

Another subject of the present invention is finally a method and a system for simultaneous artificial spatial processing of several sources, with controls of each early echo and of the clarity for each of the sources.

The method and the system for real-time artificial spatial processing of a digital audio signal x(k) in order to create a spatially processed audio-digital signal y(k) consists in, respectively allows for, effecting from elementary replica signals xi(k) of the digital audio signal, a plurality of different delays in order to create a plurality of delayed elementary signals and a linear combination between the delayed elementary signals in order to obtain a plurality of combined delayed elementary signals, one at least of each of the said combined delayed elementary signals being added to at least one elementary signal xi(k) prior to delaying the latter. The delayed elementary signals are subjected to a weighted summation with the digital audio signal x(k) in order to create the spatialised digital audio signal y(k). They are noteworthy in that, for the purpose of simulating a late reverberation phenomenon, they consist in, respectively allow for, effecting the aforesaid linear combination through a unitary feedback, for which the plurality of combined delayed elementary signals possesses the same energy as the delayed elementary signal, and, with each different delay, effecting an attenuation Hi(ω) of the corresponding delayed elementary signals dependent on the audio frequency, this attenuation being a decaying monotonic function of the reverberation time and proportional to each delay, then, before weighted summation of the delayed elementary signals with the digital audio signal x(k), effecting a spectral correction satisfying the relation:

$$|t(e^{j\omega})|^2 = \frac{\Sigma\tau i}{Tr(\omega)}$$

where τi, defined as the absorbent delay, designates the value of each delay increased by the phase delay afforded through the corresponding attenuation Hi(ω), Στi designating the sum of all the absorbent delays.

The method and the system for real-time artificial spatial processing of a digital audio signal find an application in the technical field of digital audio signal processing more particularly in the phonograph and/or videograph production industries.

BRIEF DESCRIPTION OF THE DRAWINGS

A more detailed description of the method and of the system for real-time artificial spatial processing of a digital audio signal in order to create a spatially processed digital audio signal which are the subjects of the present invention will be given below in the description and the drawings in which, apart from FIGS. 1*a* to 1*e* of the prior art, FIG. 3*a* represents, in the form of functional blocks, a system for real-time artificial spatial processing of a digital audio signal according to the subject of the present invention for a monophonic digital audio signal, FIGS. 3*b*, 3*c*, 3*d*, 3*e* and 3*f* represent, in the form of block diagrams, variant embodiments of the system which is the subject of the present invention such as are represented in FIG. 3*a*, FIGS. 5*b* and 5*c* represent a simplified variant realisation of the system according to the invention represented in FIG. 5*a*, FIG. 5*d* represents an embodiment of a spectral correction module and of an attenuation element of a delay pathway in the system according to the subject of the present invention, FIG. 5*e* is a plot showing the relationship between the parameters in FIG. 5*d*, FIGS. 6*a*, 6*b*, 6*c* and 6*d* respectively represent various echograms relating to a monophonic reverberant filter simulating the late reverberation engendered by the comb sum structure; a structure according to FIG. 3*e* for N=8; a comb sum structure, and 6*b* 2), the structure represented in FIG. 3*b*, for N=12.

DETAILED DESCRIPTION OF THE PREFERRED EMBODIMENTS

Figure 1A:
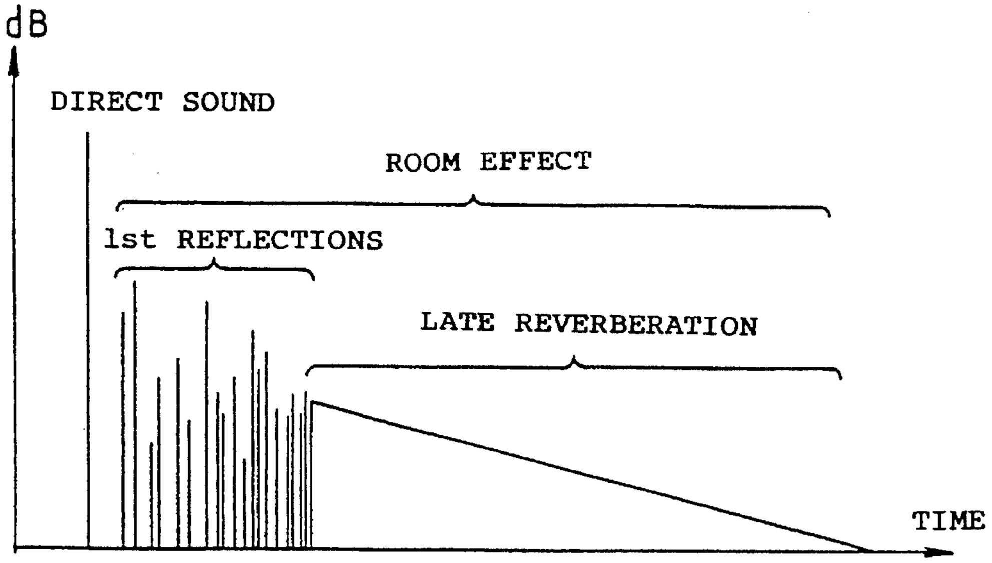
FIG. 1a. (PRIOR ART)
Figure 1B:
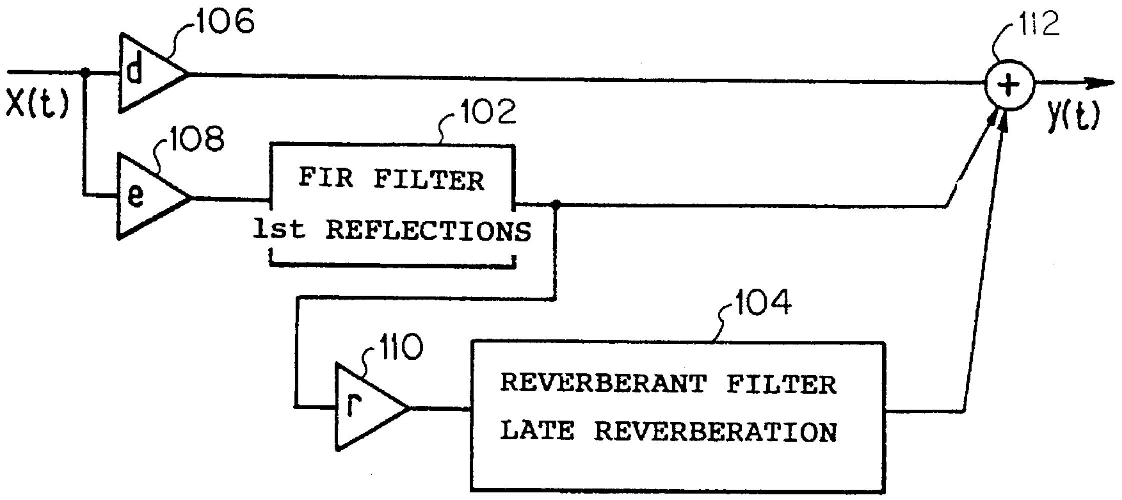
FIG. 1b. (PRIOR ART)

A more detailed description of the method for real-time artificial spatial processing of a digital audio signal which is the subject of the present invention will be given firstly in connection with FIG. 2*a*.

According to the aforesaid figure, the digital audio signal is denoted x(k), this signal consisting of a sequence of samples of a coded digital audio signal.

According to the method which is the subject of the present invention, the digital audio signal x(k) is duplicated into elementary signals xi(k) obtained from the audio-digital signal by matched corresponding weighting bi. The elementary signals xi(k) are each subjected to a different delay in order to create a plurality of delayed elementary signals. In FIG. 2*a*, it will be noted that the delay for the elementary signal xi(k) is denoted $Z^{-mi}$, a notation in which Z represents, according to complex notation, the variable $e^{j\omega}$, an expression in which ω represents the angular frequency, ω=2πfT, f being the relevant audio frequency, T the sampling period and mi the delay coefficient for the relevant elementary signal xi(k). Each delayed elementary signal is denoted seri and corresponds to the relevant elementary signal xi(k).

According to another characteristic of the method which is the subject of the present invention, a linear combination between the delayed elementary signals, seri, is effected to obtain a plurality of combined delayed elementary signals, denoted serci. It will be noted that the aforesaid linear combination is of the form:

$$serci = \sum_{j=1}^{N} aji \cdot serj. \tag{1}$$

According to another advantageous aspect of the method which is the subject of the present invention, one at least of each of the combined delayed elementary signals, serci, is added to at least one elementary signal xi(k) prior to delaying the latter. Furthermore, the delayed elementary signals, seri, are subjected to a weighted summation with the digital audio signal x(k) in order to create the spatially processed digital audio signal, denoted y(k). It will be noted that in FIG. 2*a*, the weighted summation is, firstly, represented by the application to each delayed elementary signal seri of a corresponding weighting coefficient, denoted ci, then summation of all the delayed elementary signals, seri, and, secondly, summation of the whole with the weighted digital audio signal x(k) to which has been applied the weighting coefficient d to create the spatially processed digital audio signal y(k).

Furthermore, the method which is the subject of the present invention consists, in order to simulate a late reverberation phenomenon, according to a particularly advantageous aspect of the latter, in effecting the aforesaid linear combination through a unit feedback. Unitary feedback is understood to mean a feedback for which the plurality of combined delayed elementary signals, serci, possesses the same energy as the delayed elementary signals, seri, namely $\Sigma seri^2 = \Sigma serci^2$. Furthermore, as is represented also in FIG. 2*a*, the method which is the subject of the present invention consists in effecting, with each different delay, an attenuation, denoted Hi(ω) of the delayed elementary signal, seri, this attenuation being dependent on the aforesaid audio angular frequency ω. According to a particcularly advantageous aspect of the method which is the subject of the present invention, this attenuation is a decaying monotonic function of the reverberation time Tr(ω), the simulation of which is desired and proportional to each delay.

Figure 2A:
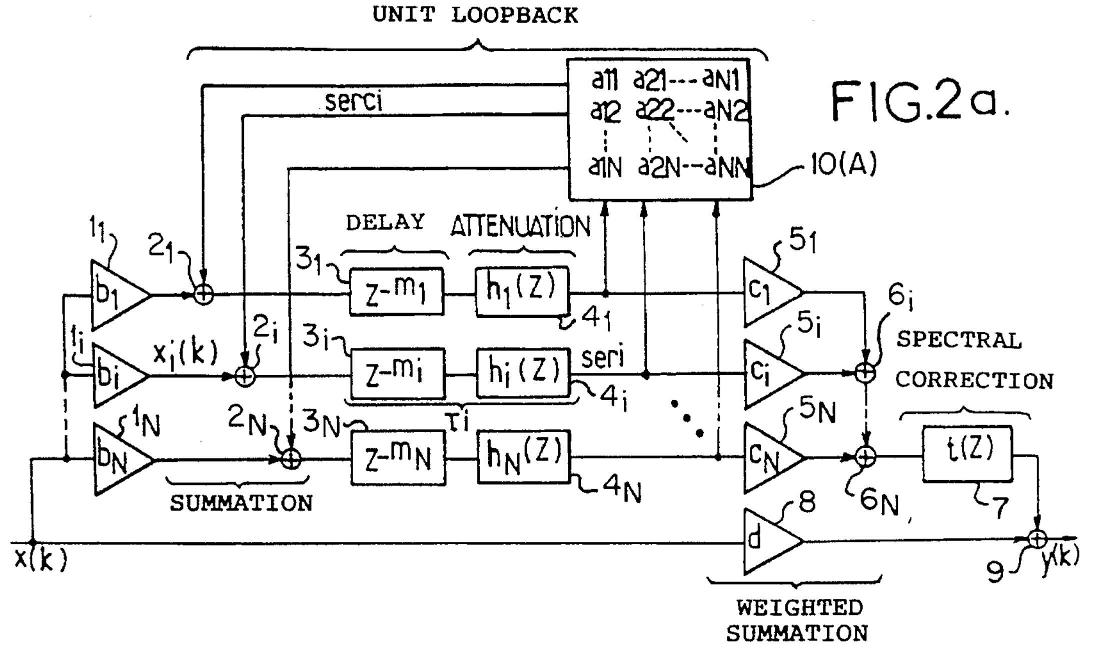
FIG. 2*a* represents, in the form of an illustrative diagram, the steps allowing implementation of the method which is the subject of the present invention.

Finally, it will be noted, as is represented in FIG. 2*a*, that the method also consists in effecting, before weighted summation of the delayed elementary signals with the digital audio signal x(k), a spectral correction denoted $t(e^{j\omega})$, satisfying the relation:

$$|t(e^{j\omega})|^2 = \frac{\Sigma\tau i}{Tr(\omega)} \qquad (2)$$

In this relation, τi, defined as the absorbent delay, in fact designates the value of each delay increased by the phase delay afforded by the corresponding attenuation Hi(ω), Στi designating the sum of all the absorbent delays. This phase delay is in fact negligible by comparison with the value of each delay and will therefore be regarded as such in the remainder of the description.

The principle of the method which is the subject of the present invention, as represented diagrammatically in FIG. 2*a*, rests on an extension of the processing proposed by STAUTNER and PUCKETTE in the document "Designing multichannel reverberators". Computer Music Journal, 6(1), 1982".It will be noted that the method which is the subject of the present invention possesses an extra degree of generality by comparison with the processing implemented previously.

Following a theoretical study undertaken by the inventors of the present invention, the function for transferring between the digital audio signal, x(k), and the spatially processed signal y(k) has enabled it to be shown that the poles of the aforesaid transfer matrix are the complex solutions of the characteristic equation:

$$\det[A - D(z^{-1})] = 0. \qquad (3)$$

In the aforesaid relation, $z^{-1}$ represents the unit delay operator and D(z) is defined by:

$$D(z) = \begin{bmatrix} z^{-m1} & & 0 \\ & \ddots & \\ 0 & & z^{-mN} \end{bmatrix} \qquad (4)$$

For a study of the function for transferring between the digital audio signal x(k) and the spatially processed digital audio signal y(k), reference may be made to the publication [JOT, CHAIGNE, 91].

According to the aforesaid theoretical study and the previously mentioned reference, a first constraint can be imposed that all the resonant modes have an identical decay time.

The solution to solving the aforesaid relation (3) then reduces to finding the matrices A and D, transfer matrices, such that the solutions of this equation, or poles of the system, all have the same modulus.

In the case where the transfer matrix A is a unit matrix, that is to say in the case where the plurality of combined delayed elementary signals, serci, possesses the same energy as the delayed elementary signals, seri, all the aforesaid poles are on the unit circle of the complex plane. The modulus of each of the poles then being equal to one, the decay time is infinite for each of the associated resonant modes, and the impulse response can be represented by a sum of non-damped sinusoids. Furthermore, the modal density is always equal to the total duration of the delays.

The method which is the subject of the present invention then consists in varying the reverberation time, while complying with the constraint of identical modulus for all the poles. Such a variation is obtained by assigning an attenuation ki to each of the previously mentioned delays.

For a transfer matrix A, corresponding in fact to a neutral matrix, forming a reference filter of a comb sum, the attenuations ki can then be chosen so as to satisfy the relation:

$$ki = \gamma^{mi} \qquad (5)$$

The aforesaid operation amounts to replacing the variable z by z/γ in the expression for the matrix D(z). All the poles of the system are therefore multiplied by the quantity γ, whatever the matrix A. For a unit matrix A, γ is none other than the modulus of the poles and the reverberation time Tr is modified and satisfies the relation:

$$\Gamma = 20.\log_{10}(\gamma) = -60.T/Tr. \qquad (6)$$

In this relation, we recall that T is the sampling period for the digital audio signal, Γ being expressed in dB.

According to the method which is the subject of the present invention, the equality constraint on the modulus of the poles is complied with when, starting from a reference filter, such as defined previously, an attenuation, proportional to the duration of each delay is assigned to the latter. The proportionality factor Γ is related to the reverberation time Tr through equation (6) mentioned previously.

According to an aspect of the method which is the subject of the present invention, achieving a given curve of variation of the reverberation time as a function of frequency is achieved when the modulus of a pole of the system producing the aforesaid linear combination, with the given angular frequency ω, is fixed by the value of the desired reverberation time Tr(ω) at the aforesaid angular frequency according to relation (6) mentioned previously. The effect of relation (5) is then to force the poles to be positioned on a curve specified by the desired variation Tr(ω) rather than on a circle centred at z=0.

The aforesaid constraint on the site of the poles leads to an optimal result regarding perception in the response to transient sounds. Indeed, it guarantees that two modes at neighbouring resonant frequencies have decay times which are as similar as permitted by the law of variation of the reverberation time chosen by the user, thus avoiding the predominance of a reduced number of modes in the extinguishing of the reverberated signal.

The method which is the subject of the present invention thus allows control of the simulated reverberation time, this control being valid whatever the structure of the reference filter, and also guarantees the absence of spurious colourations when transient signals are present.

As mentioned previously, the method which is the subject of the present invention then consists in assigning a frequency-dependent attenuation to each delay by means of an absorbent filter with transfer function hi(z) as mentioned in FIG. 2*a*.

The frequency response of each absorbent filter is given by the relation expressing the attenuation in decibels:

$$Hi(\omega) = 20 \cdot \log_{10}|hi(e^{j\omega})| = \frac{-60 \cdot T.}{Tr(\omega)}\left(mi - \frac{arg[hi(e^{j\omega})]}{\omega}\right) \qquad (7)$$

In the aforesaid relation, $arg[hi(e^{j\omega})]/\omega$ represents the phase delay of the absorbent filter. By reason of the tight relationship existing between each delay and the absorbent filter associated with it, the absorbent delay is defined as described earlier.

More specifically, it will be noted that the insertion of absorbent filters has the effect of modifying the spectral envelope of the response finally obtained, since, compare [JOT, CHAIGNE, 91 ], the energy of each resonant mode is proportional to the latter's decay time.

According to a particularly advantageous aspect of the method which is the subject of the present invention, the spectral balance of the response thus obtained is obtained through the spectral correction t(z), this spectral correction being inversely proportional to the reverberation time Tr(ω) in the frequency domain of the processed digital audio signal.

It will furthermore be noted that, when the durations of the delays are all multiplied by the same given coefficient α, in the absence of any modification of the attenuations of the absorbent filters, the impulse response of the method which is the subject of the present invention is dilated temporally through a homothety with ratio α, but the average energy of the reverberated signal, in any given frequency band, is not modified. Such a multiplication in fact simulates a homothety with ratio α on the dimensions of the simulated auditorium, and has the effect of modifying the resonant frequencies whilst multiplying the reverberation time by α at each frequency. The dividing of the reverberation time by α in order to reduce the latter to the initial situation has the effect of dividing the energy of the spatially processed signal by the same quantity α.

Thus, in order to be able to independently control the reverberation time, the spectral envelope of the reverberated signal, viz the spatially processed digital audio signal y(k), and the size of the audition piece associated with the total duration Στi of the delays, the spectral correction t(z) satisfies relation (2) mentioned previously in the description.

A more detailed description of the implementation of the method which is the subject of the present invention will now be given in connection with FIGS. 2b and 2c.

Figure 2C:
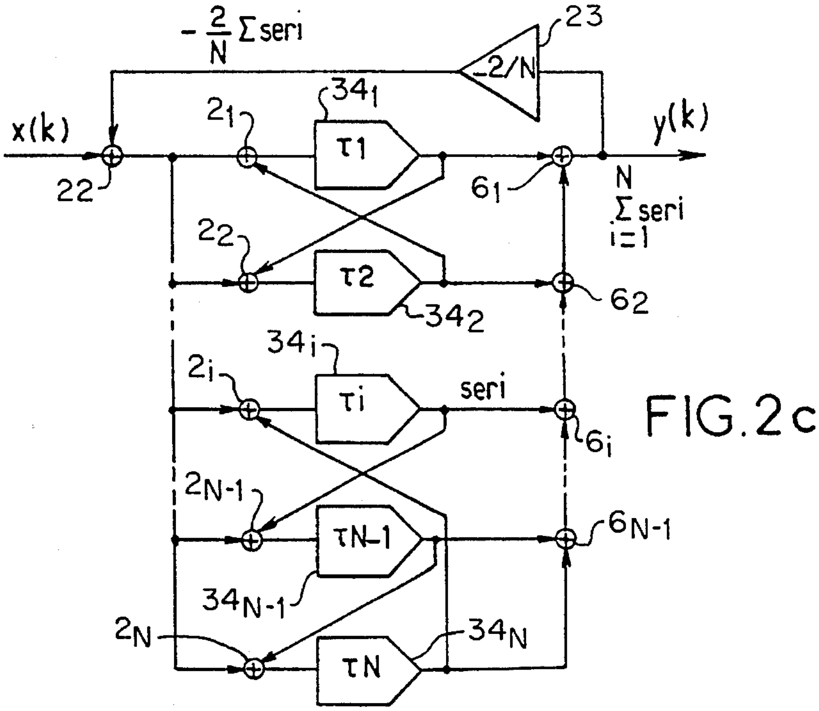
FIG. 2*c* represents, in the form of an illustrative diagram, another variant implementation of the method which is the subject of the present invention such as represented in FIG. 2*a*.
Figure 2B:
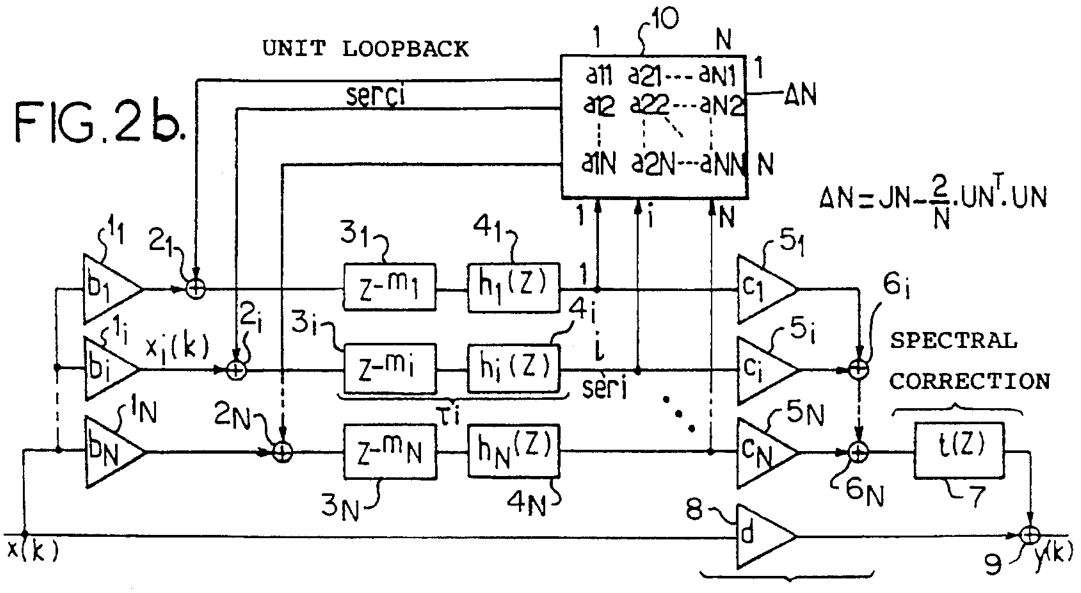
FIG. 2*b* represents, in the form of an illustrative diagram, a first variant implementation of the method which is the subject of the present invention such as represented in FIG. 2*a*.

In such a case, as is represented in FIG. 2b, the unitary feedback mentioned previously can be produced by means of a feedback matrix denoted AN, this feedback satisfying the relation:

$$AN = JN - \frac{2}{N} \cdot UN^T \cdot UN \quad (8)$$

In the aforesaid relation:

AN is the feedback matrix of dimension N×N with transfer coefficients aij,

JN is a transfer matrix obtained by permuting the rows or columns of the neutral transfer matrix IN of dimension N×N, $UN^T$ is the transposed column vector of the row vector UN of dimension N, where UN=[1, 1 . . . , 1,1].

The reason for choosing the feedback matrix AN satisfying the relation mentioned previously is that the introduction of the matrix $UN^T$.UN makes it possible to effect the multiplication of the vector formed by all the seri by the latter matrix simply, by adding up the components of this vector. Thus, for the latter matrix, the contribution of the feedback to the input signal of each delay is none other than the sum of the output signals seri from all the delays, which sum can also be used as reverberated signal as FIG. 2c will show.

The feedback matrix, denoted AN, must fulfil the following criteria:

be a unit matrix: the column vectors of the matrix AN having to form an orthonormal basis, permit a reduction in the cost of computation, maximise the echo density of the impulse response, the feedback matrix AN having therefore to have as few zero coefficients as possible.

The abovementioned relation (8) satisfied by the feedback transfer matrix AN enables the previously mentioned criteria to be fulfilled.

The unitary character of the feedback matrix AN is guaranteed if the matrix JN is obtained by permuting rows or columns of the neutral matrix IN of dimension N, or when some rows or columns of AN are replaced by their additive opposites.

It will be noted that the action of replacing column i of the feedback matrix AN by its additive opposite is equivalent to inserting a phase opposition at the output of delay i, whilst the same operation on row j amounts to inserting a phase opposition at the input of delay j. More generally, it will be pointed out that the unitary character of the feedback is retained when one or more delays are replaced by systems which are themselves unitary, that is to say all-pass.

The feedback transfer matrices satisfying the aforesaid relation (8) also making it possible to obtain a maximum echo density for a given number N of delays with however a minimum computational cost, that is to say 2.N additions-multiplications as FIG. 2c will show. The total duration of the delays being fixed by the size of the room for which the reverberation is to be simulated, the number N of delays determines the time required in order that the temporal density of the echoes be constructed within the impulse response.

In accordance with FIG. 2c, in a practical embodiment, and such that, for a plurality of N delayed elementary signals, each signal being denoted seri, this embodiment consists in reinjecting according to a bijective correspondence at the input of rank i of each delay of a delayed elementary signal, the corresponding absorbent delays being denoted τi in FIG. 2c, a delayed elementary signal of any rank j. Thus, each delayed elementary signal of rank i, seri, is to be reinjected at the input of an elementary signal xj(k), on condition that the injection of an output i into an input j is carried out only once for each input and each output.

Furthermore, in this operation, each delayed elementary signal seri is diminished by the sum weighted by the ratio 2/N of the delayed elementary signals. Thus, in FIG. 2c, each elementary signal xi(k) is added for example to a delayed elementary signal seri, the resulting sum being subjected to the corresponding delay τi, viz the absorbent delay, and the set of delayed elementary signals being summed to give the sum of the delayed elementary signals, $$\sum_{i=1}^{N} seri$$

this sum being reinjected after weighting by the coefficient −2/N with the input digital audio signal x(k).

A more detailed description of the implementation of the method which is the subject of the present invention, with a view to controlling the moments of arrival and the amplitudes of the early echoes, without however introducing any phenomenon of colouration of the reverberated or spatially processed signal, will be given in connection with FIG. 2d.

According to the aforesaid figure, the method consists in effecting a temporal shift t1, ti, tN, of the instants of arrival at the level of the feedback of the elementary signals, this temporal shift of the instants of arrival thus having the effect of engendering a separation of the elementary signals as a result of the aforesaid shift. Of course, the elementary signals, denoted for example xi(k), are then shifted in time by the difference of two successive shift instants.

Figure 2D:
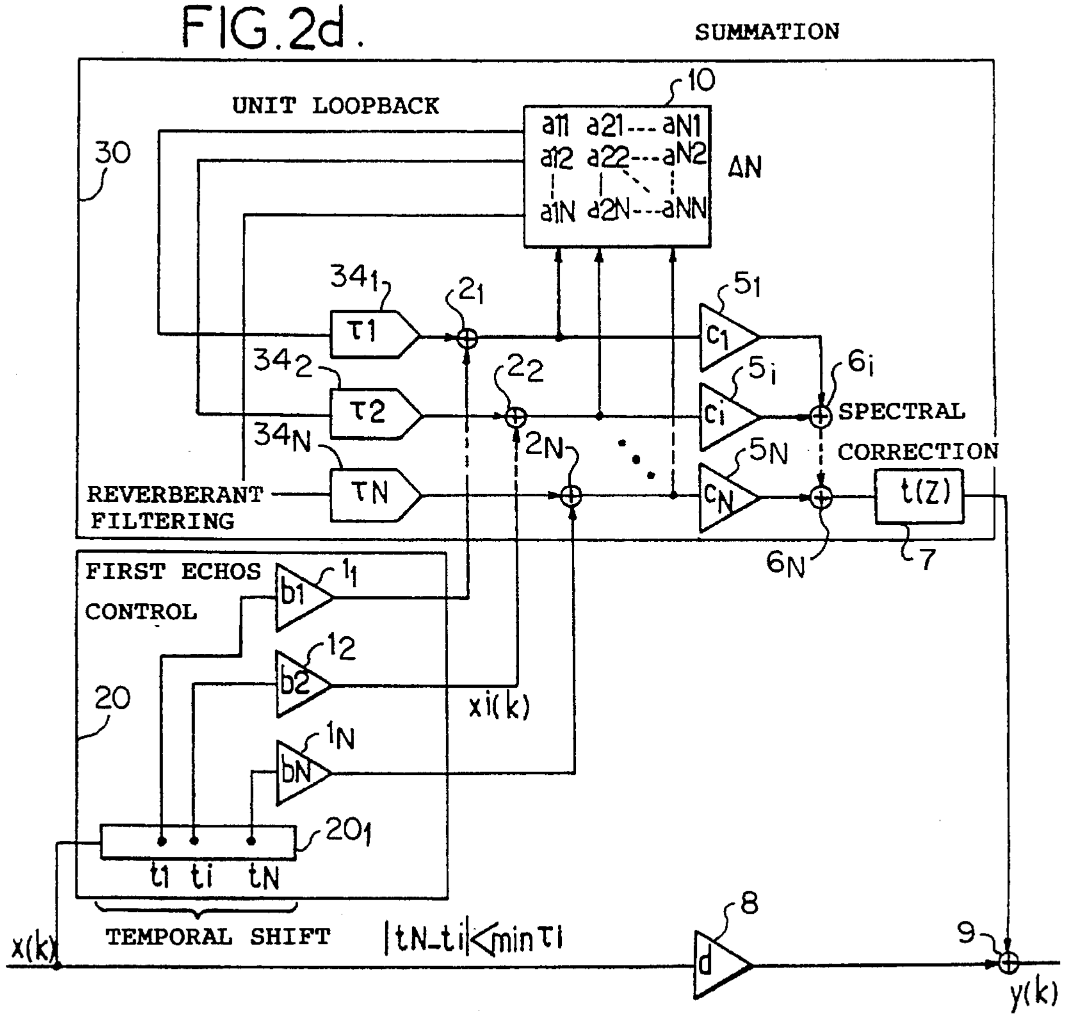
FIG. 2*d* represents, in the form of an illustrative diagram, a variant implementation of the method which is the subject of the present invention more particularly intended to ensure control of the first echoes, without however engendering a phenomenon of colouration of the simulated late reverberation.

Furthermore, the method which is the subject of the present invention as represented in FIG. 2d consists, the elementary signals xi(k) now being shifted, in choosing a deviation in shift between the largest and the smallest of the instants of arrival, symbolised by t1 and tN in FIG. 2*d*, less than the smallest value of the previously mentioned absorbent delays $\tau i$. Thus, this choice makes it possible to constitute the shifted elementary signals as a plurality of early echoes, ahead of the simulated late reverberation, the shifted elementary signals xi(k) of course being injected downstream of each corresponding absorbent delay $\tau i$, thus making it possible, by virtue of the choice of the aforesaid temporal shift, to inject the shifted elementary signals xi(k) and to transmit them as first echoes before transmitting the signals corresponding to the procedure for processing by reverberant filtering, as is represented in FIG. 2*d*. It will of course be noted that the procedure for controlling the first echoes by the aforesaid temporal shift also makes it possible to control not only the instants of arrival ti, but the amplitudes of the latter through the coefficients bi independently of the durations $\tau i$ of the absorbent delays of the reverberant filtering procedure.

The principle of the method which is the subject of the present invention as represented in FIG. 2*d* differs from the comparable prior art methods described in particular by STAUTNER and PUCKETTE with regard to the following points:

- the moments of arrival of the order 1 echoes or first echoes are not limited by the absorbent delay durations $\tau i$,
- the method according to the invention introduces no finite impulse response filtering, FIR filtering, capable of imposing a colouration which may be prejudicial to the simulated late reverberation, although the latter is thus made dependent on the set of early echoes chosen by the user, which will turn out to be particularly useful for ensuring simultaneous spatial processing of several sound sources.

This second point is explained in particular by considering the impulse response during the filtering procedure according to the method according to the invention. If the total duration of the delays $\Sigma\tau i$, viz the absorbent delays, is sufficient, of the order of a second, the modal density is such that this response is perceived as stationary white noise once the time required for the density of echoes to stabilise has elapsed.

Moreover, it can be verified experimentally that this impulse response can be regarded as a sum of elementary white noises each associated with a pair bi, cj, these elementary responses being mutually uncorrelated pseudo-random white noises. It follows from this that the choice of the weighting coefficients bi and ci such as are represented in FIG. 2*d*, although they modify the distribution of energy according to the resonant modes, has no perceptible effect on the timbre of the late reverberation, nor on the choice of shifts ti either.

A particularly advantageous variant of the method which is the subject of the present invention will now be described in connection with FIG. 2*e*, in the case where separate control of the clarity and directions of origin of early echoes from monophonic sources in a stereophonic transmission subjected to the method of spatial processing which is the subject of the present invention, is carried out.

Figure 2E:
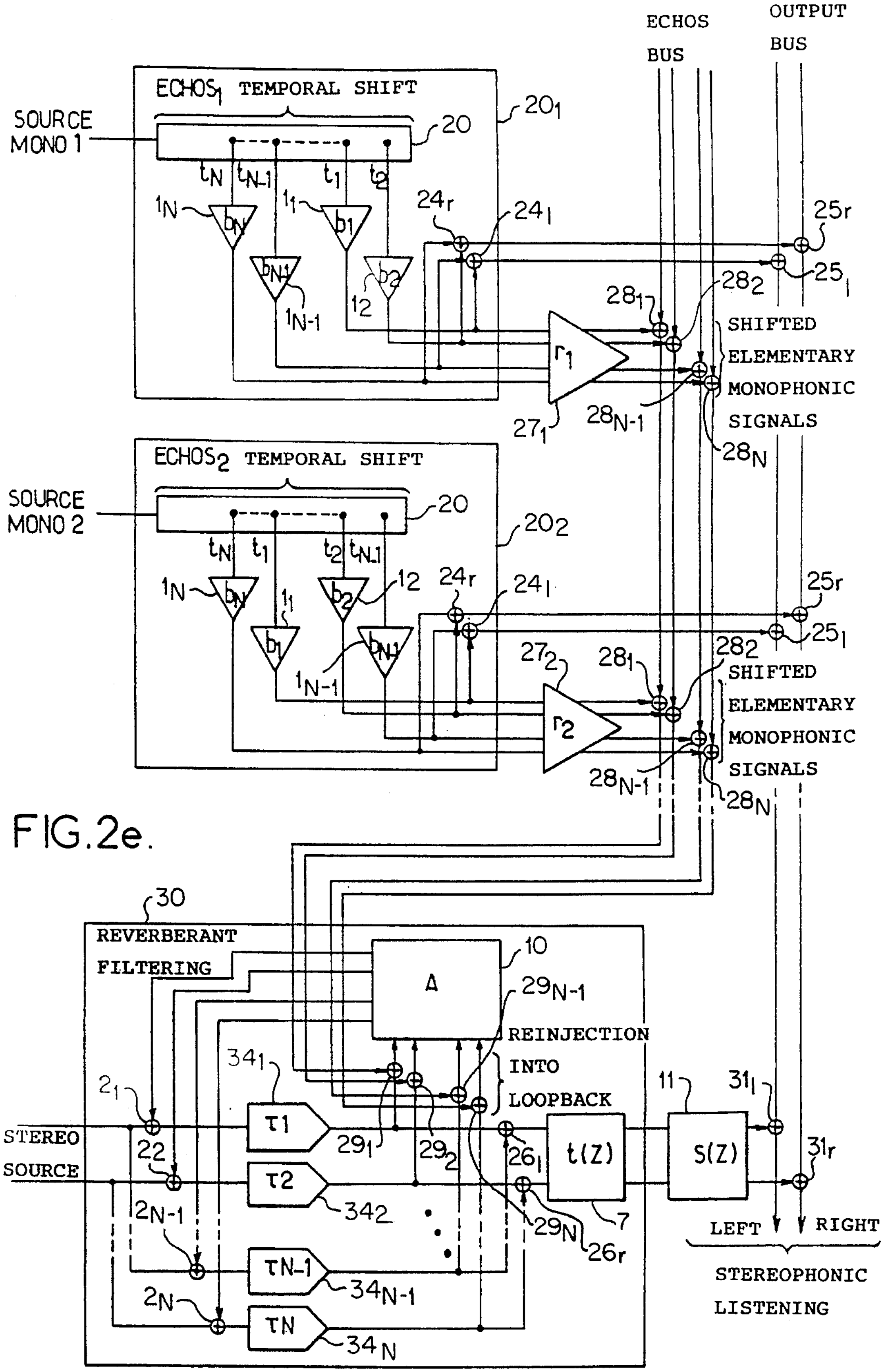
FIG. 2*e* represents a variant implementation of the method according to the invention illustrated in FIG. 2*d* and more particularly adapted for creating a stereophonic spatialised signal and allowing at one and the same time simultaneous spatial processing of monophonic sources and control of the clarity of the latter.

Generally, consideration will be given to a recording or the transmission of a recording of stereophonic digital audio signals, subjected to the method of spatial processing which is the subject of the present invention by means of reverberant filtering, as is represented in FIG. 2*e*.

Control of the clarity and of the direction of origin of echoes from monophonic sources in such a situation is particularly advantageous, in particular in the case where these monophonic sources are none other than source elements of the corresponding stereophonic recording, that is to say the aforesaid monophonic sources are elements of the source of the stereophonic signals subjected to the method of spatial processing according to the subject of the present invention. Such a situation can be encountered, in particular, when recording or retransmitting a stereophonic recording of a concert given by a symphony orchestra in which one or more instruments, and in particular the collection of the latter, desire to be highlighted.

In such a case, the method which is the subject of the present invention consists in submitting each monophonic signal, denoted source mono 1 respectively mono 2 by way of example in FIG. 2*e*, to a procedure of temporal shifting of the instants of arrival of this signal to create, just as in the case of FIG. 2*d*, a plurality of N corresponding shifted elementary monophonic signals, so as to constitute the shifted elementary monophonic signals as a plurality of corresponding order 1 echoes.

The shifted elementary monophonic signals are then injected into the feedback applied to the stereophonic signals subjected to the procedure for simulated reverberation by summation, before feedback, with the delayed elementary stereophonic signals.

The method which is the subject of the invention and such as described in connection with FIG. 2*e* thus makes it possible to assign a distinct room effect to each source, the differences between the impulse responses assigned to the various sources being characterised in the manner below:

- distribution of specific early echoes for each source,
- specific clarity value for each source,
- simulated late reverberation taking into account the spatial separation between the sources, the contributions of the various sources to the late reverberation being mutually uncorrelated.

It also makes it possible to preserve the independence between the control of the early echoes and the control of the late reverberation whilst precluding, in particular, the control of the early echoes from engendering a colouration of the late reverberation.

A more detailed description of a system for realtime artificial spatial processing of a digital audio signal according to the subject of the present invention will now be given in connection with FIG. 3*a*.

In the aforesaid figure, the same symbols relating to the signals represent the same signals as in the case of FIG. 2*a* relating to the method which is the subject of the present invention.

Thus, as will be observed in FIG. 3*a*, the system which is the subject of the present invention comprises delay pathways, denoted Vi, each consisting for example in succession of a multiplier element, denoted 1*i*, a summing element, 2*i*, a delayer element, 3*i*, and a multiplier element, 5*i*, in cascade, each delay pathway being joined to a summing element, denoted 6*i*, labelled with the index of the corresponding delay pathway, except possibly as regards the order 1 delay pathway, V1. Of course, for an N-pathway system, feedback is ensured by means of a feedback matrix 10, formed by the matrix AN mentioned previously in the description, the latter consisting of a network of multiplier and adder elements making it possible to deliver the combined delayed elementary signals, serci, feedback being ensured at the level of each summing unit, 2*i*, of each delay pathway. The digital audio signal x(k) is thus duplicated into elementary signals xi(k) feeding each delay pathway, Vi, and a summing element 9 makes it possible, after weighting the digital audio signal, x(k), by a multiplier element 8 to deliver the spatially processed signal y(k), the summing element furthermore receiving the weighted sum of the delayed elementary signals, seri, delivered by each delay pathway, Vi, this weighted sum furthermore being subjected, by way of the spectral correction element 7, to a spectral correction satisfying relation (2) mentioned previously in the description.

Furthermore, in accordance with a particularly advantageous aspect of the system which is the subject of the present invention, an absorber element, denoted **4*i*, whose transfer function engenders an attenuation Hi(ω) of each delayed elementary signal, is associated with each delay element, 3*i*, contained in each delay pathway, Vi, this attenuation being a decaying monotonic function of the reverberation time Tr(ω) and proportional to each delay created by each corresponding delay element 3*i***.

Thus, as described previously in the description, it will be noted for the sequel that each delay element **3*i* associated with each attenuation element 4*i* is denoted symbolically, as represented in FIG. 3*a*, by 34*i*. Thus, each reference 34*i***, with i ϵ [1,N] is such that the delay τi finally afforded is defined as the absorbent delay, as mentioned previously in the description.

It will be noted that more generally the system for artificial spatial processing which is the subject of the present invention such as represented in FIG. **3*a*** constitutes a reverberant filter formed by a reference filter, as mentioned previously in the description, in which has been inserted, for each attenuation pathway Vi, an attenuation function by the element *4*i, under the conditions relating to the reverberation time Tr(ω) and the delay, denoted $z^{-mi}$, as mentioned previously in the description.

It is pointed out that the reference filter is completely characterised by the durations of the delays $z^{-mi}$ the coefficients bi, ci having been defined, it being possible to choose the latter to be mutually irrational so as to avoid echo superpositions, and are such that their sum is proportional to a dimension characteristic of the phenomenon of the room to be simulated.

The structure of the reverberant filter represented in FIG. **3*a* is then defined by the vectors b={bi} and c={ci} of dimension N, and of course by the loopback transfer matrix A of dimension N×N, the components of the aforesaid vectors corresponding to the values of gain of the multiplier elements 1*i*, respectively 5*i*, the coefficient d defining the value of gain of the multiplier element 8**.

It will in fact be noted that the multiplier elements **1*i*, 5*i* or 8, the summing elements 2*i*, 6*i* or the multiplier elements and the summing elements making up the network forming the transfer matrix 10**, the matrix A, of dimension N×N, may of course be produced either with corresponding digital computation circuits, or of course, preferably, with program modules enabling the corresponding arithmetic operations to be applied to the samples of the various signals mentioned earlier. In the latter case, the computations may advantageously be conducted by means of one or more computational procedures, for example DSP 56000 microprocessors marketed by the MOTOROLA company, the corresponding indications of which will be given further on in the description.

It is recalled that the matrices A, denoted AN, satisfying relation (8) mentioned previously in the description, make it possible to obtain a maximum echo density for a number N of given delays with a minimum computational cost, in terms of number of multiplier or adder elements required to produce the feedback.

The loopback transfer matrices thus adopted make it possible to produce feedbacks which are characterised by the fact that the input of each delay, that is to say each summing element **2*i***, receives the output signal from another delay, through a bijective correspondence, diminished by the sum multiplied by 2/N of the output signals from the N delays. This class of loopback matrix and the corresponding feedbacks make it possible to maximise the echo density, and are in fact only distinguishable from one another through the choice of the matrix JN in the aforesaid relation (8).

A more detailed description of feedbacks and hence of corresponding circuits produced in accordance with the subject of the system according to the invention and fulfilling the aforesaid conditions, that is to say a feedback produced through the choice of various matrices JN in the previously mentioned relation (8), will be given in connection with FIGS. **3*b* to 3*f*** below.

A first choice can consist in taking JN=IN, the neutral matrix.

The reverberant filter thus produced is represented in FIG. **3*b*, and appears as a comb sum filter in which the output of the filter has been fed back to the input by means of a multiplier element 23 with gain −2/N. In the aforesaid FIG. 3*b* can be seen an input summing element 22 making it possible to ensure the aforesaid feeding back as well as the various summing elements 2*i*, absorbent delay 34*i* of value τi, and summing units 6*i*, making it possible to ensure feedback of the whole. Of course, the value of the gain of the multiplication element 23 can be, either −2/N if the summing units 22 or 2i provide a positive summation, or the value 2/N if the summing elements 22 or 2*i*** are algebraic summing elements, the loopback being effected on a subtraction input.

In the case, on the contrary, where the matrix JN is obtained by left cyclic permutation of the columns of the neutral matrix, IN, there is obtained in succession as transfer matrix for feedback AN, for N>2, $$A3=\frac{1}{3}\begin{bmatrix}-2 & -2 & 1\\ 1 & -2 & -2\\ -2 & 1 & -2\end{bmatrix} \tag{9}$$

$$A4=\frac{1}{2}\begin{bmatrix}-1 & -1 & -1 & 1\\ 1 & -1 & -1 & -1\\ -1 & 1 & -1 & -1\\ -1 & -1 & 1 & -1\end{bmatrix}$$

$$A5=\frac{1}{5}\begin{bmatrix}-2 & -2 & -2 & -2 & 3\\ 3 & -2 & -2 & -2 & -2\\ -2 & 3 & -2 & -2 & -2\\ -2 & -2 & 3 & -2 & -2\\ -2 & -2 & -2 & 3 & -2\end{bmatrix} \text{ etc...}$$

An embodiment making it possible to obtain the aforesaid feedback in which the feedback matrix for feedback AN satisfies the previous relation (9) has thus been represented in FIG. **3*c*. The system which is the subject of the present invention, such as represented in FIG. 3*c*, constitutes a monophonic, reverberant filter, noteworthy in that it uses a main loop formed substantially by the various delay pathways Vi connected in cascade, the multiplication element and hence gain values bi and ci not having been represented, having been made equal to 1, so that the absorbent delays τi are connected in series by way of corresponding summing elements 2*i*, the feedback being produced by the multiplier element 23 by way of the input summing element 22, this allowing reinjection of the resulting sum signal x(k)−2/N.(y(k)) at the level of each of the summing elements 2***i*, the outputs from each absorbent delay 34*i*, the signals seri, being summed by way of a plurality of summing elements 6*i* cascaded to deliver the spatially processed digital audio signal y(k).

The monophonic reverberators as represented in FIG. 3*b* and 3*c* can, if appropriate, engender a spurious echo whose moment of arrival corresponds to the sum of the durations of the absorbent delays Στi. The amplitude of this spurious echo decays as the number N of delays increases and this echo fades into the reverberation when N>12. When it is audible, this spurious echo is not present at the output of each of the N absorbent delays 34*i*, but arises from the interference between these signals.

Figure 3D:
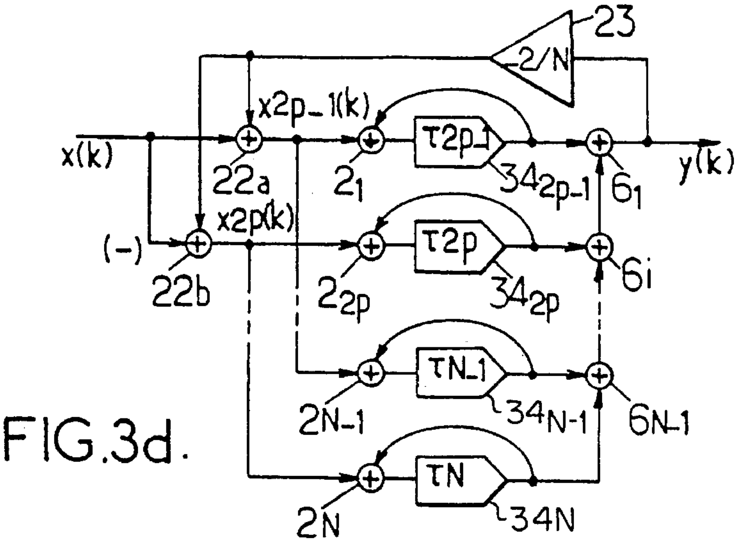
Figure 3E:
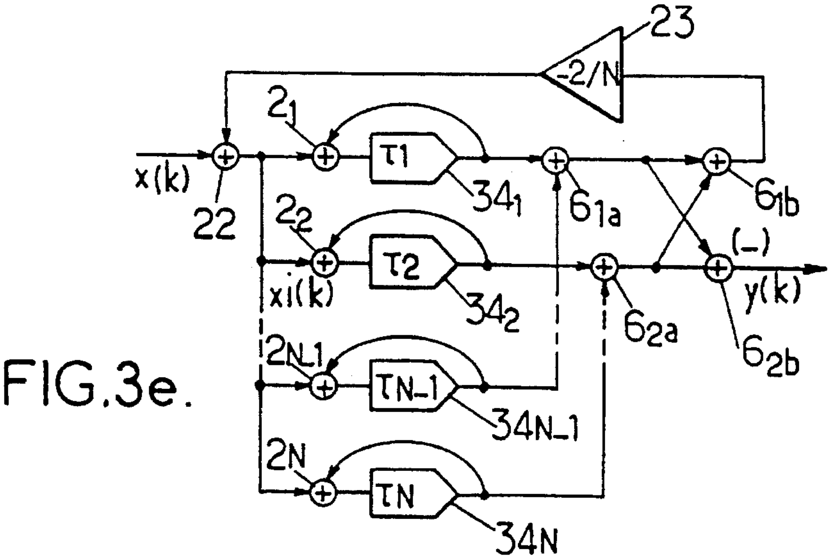

The embodiments represented in FIGS. 3*d* and 3*e* allow the suppression of the aforesaid interference phenomenon, by duplicating and setting into phase opposition, at the input or at the output of the reverberant filter of the duplicated input, respectively output signals.

Thus, in FIG. 3*d* the elementary signals are duplicated into elementary signals of odd rank x2p−l(k) and even rank x2p(k), and set into phase opposition by way of a first summing element, 22*a*, respectively corresponding second subtractor element, 22*b*, the corresponding delayed elementary signals of course being summed by the corresponding summing elements 6*i* and the weighted reinjection by the multiplier element 23 being effected at the level of the first, 22*a*, respectively second 22*b*, summing element, respectively subtractor. In FIG. 3*e* on the contrary, the input elementary signals, xi(k), are kept without duplication whilst the duplication is effected at the level of the delayed elementary signals, seri, with i=2p for the signals of even rank, or 2p−1 for the signals of odd rank. The summation of the aforesaid signals of even, respectively odd rank, is effected by the summing elements $\mathbf{6}_{1a}$, of odd rank, respectively $\mathbf{6}_{2a}$ of even rank, and the loopback is effected by way of a duplicated, extra output summing element $\mathbf{6}_{1b}$, respectively $\mathbf{6}_{2b}$, the summing element $\mathbf{6}_{1b}$ receiving the signals delivered by the summing element $\mathbf{6}_{1a}$, respectively $\mathbf{6}_{2a}$, and delivering the sum signal to the multiplier element 23, whilst the subtractor element $\mathbf{6}_{2b}$ receives the signals delivered by the summing element $\mathbf{6}_{1a}$, respectively $\mathbf{6}_{2a}$, and delivers the spatially processed digital audio signal y(k).

Figure 3F:
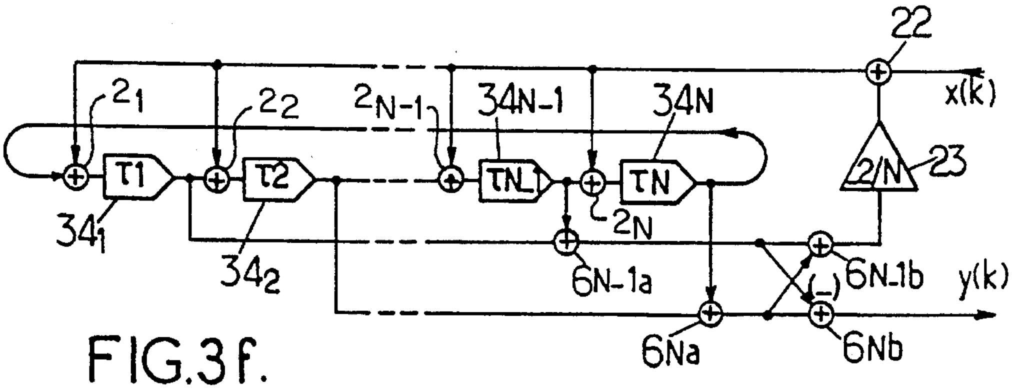

Finally, in FIG. 3*f*, there is represented an arrangement similar to that of FIG. 3*c*, in which, so as to suppress the interference mentioned previously, the output circuit, that is to say the circuit delivering the spatially processed digital audio signal, y(k), is subdivided into two circuits relating to the delayed elementary signals of even rank, respectively odd rank, in a way similar to the output circuit of FIG. 3*e*, the corresponding summing elements being denoted 6N-1*b*, respectively subtractor element 6Nb, and playing the role of the summing, respectively subtractor elements, $\mathbf{6}_{1b}$, $\mathbf{6}_{2b}$, of FIG. 3*e*.

A more detailed description of a system which is the subject of the present invention allowing the spatial processing of a digital audio signal in which the position of the sound source in the simulated room is taken into account, through the intermediary of the control of the N first echoes, will be given in connection with FIG. 4.

The system which is the subject of the present invention makes it possible to avoid any phenomenon of colouration of the reverberated signal.

Figure 4:
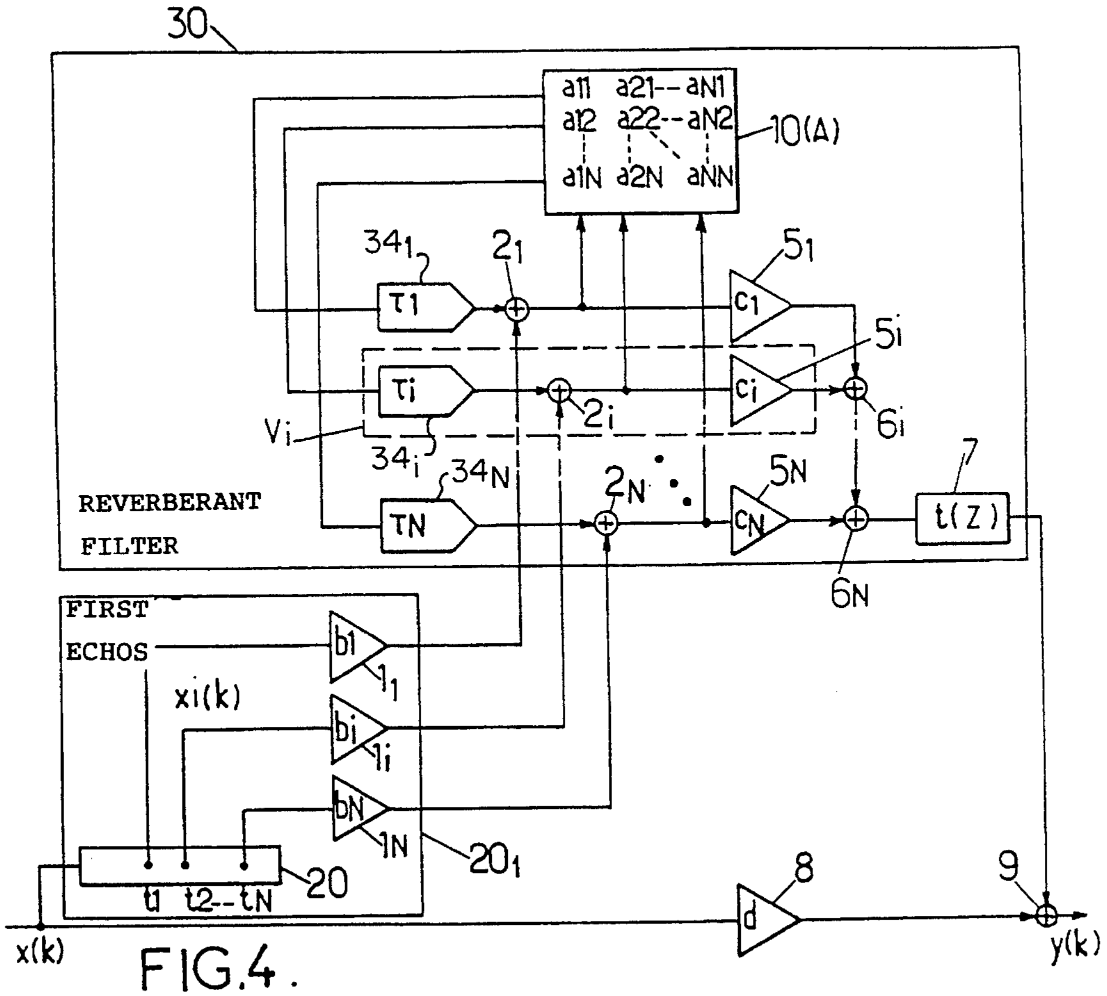
FIG. 4 represents, in the form of functional blocks, the general structure of a system according to the subject of the present invention constituting a reverberant filter allowing control of the first echoes, without affecting the timbre of the simulated late reverberation, for a monophonic digital audio signal.

Thus, as will be observed on looking at FIG. 4, the system which is the subject of the present invention comprises a module for processing the first echoes, denoted 20, and the reverberant filter proper, denoted 30, which corresponds substantially to the reverberant filter represented in FIG. 3*a*.

Whereas in FIG. 3*a*, for example, each of the delay pathways of rank i is such that the delayer module 3*i* with delay coefficient mi and the attenuator module 4*i* form an absorbent delay module 34*i* placed for example downstream of the summing module of the delay pathway, viz the corresponding summing module 2*i*, it may be observed that in FIG. 4 the absorbent delay module 34*i* is on the contrary placed upstream of the corresponding summing module 2*i* of the delay pathway Vi.

As will furthermore be observed on looking at FIG. 4, the elementary signals xi(k) are delivered after weighting by the multiplier modules 1*i*, with multiplication coefficient bi, by way of a delay module, denoted 201, in FIG. 4. The delay module 201 makes it possible to delay the instants ti of arrival of the corresponding elementary signals in order, in fact, to constitute shifted elementary signals as a plurality of order 1 echoes ahead of the simulated late reverberation. The module 20 and the multiplier coefficients bi of the multiplier elements 1*i* constitute a module for processing the first echoes interconnected with the reverberant filter 30 proper. It will be recalled that the module for the first echoes 20 makes it possible to control the instants of arrival ti independently of the delay durations of the reverberant filter proper. The role of the coefficients bi of the multiplier elements 1*i* of the module for first echoes 20 is slightly modified by comparison with the case of FIG. 3*a*. The values of absorbent delays τi engendered by the absorbent delay elements 34*i* can then be chosen bearing in mind the values ti of the instants of arrival as already mentioned in connection with FIG. 2*d*. In the case where the delay intervals ti are identical to the absorbent delays τi, the reference filters of FIGS. 3*a* and 4 are strictly equivalent, but when the attenuation elements 4*i* are present, the two systems differ through the fact that in FIG. 4 the order 1 echoes, that is to say the first echoes, do not undergo the absorbent filterings. The system as represented in FIG. 4, provided with its module for processing the first echoes, makes it possible to avoid any phenomenon of colouration of the late reverberation, whatever distribution is chosen for the early echoes.

The system for spatial processing of a digital audio signal which is the subject of the present invention as described previously in connection with FIGS. 3*a* to 3*f* and 4 essentially constitutes a monophonic reverberant filter.

However, the system which is the subject of the present invention is not limited to the processing of monophonic digital audio signals alone.

Figure 5B:
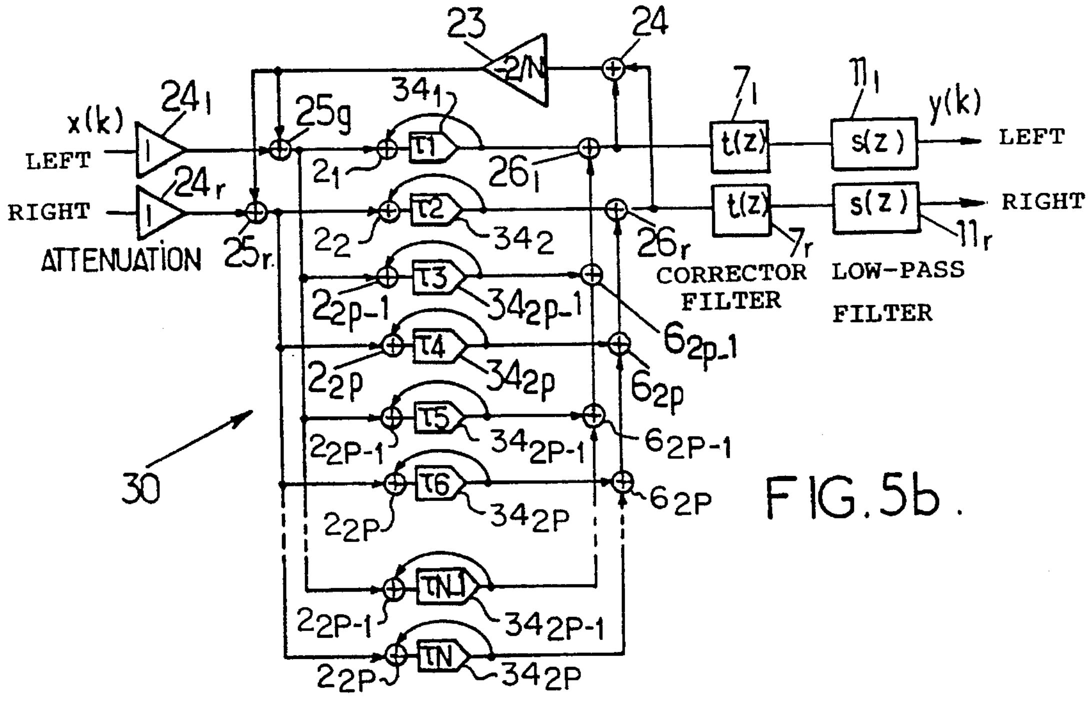

A more detailed description of a system for spatialisations of a stereophonic digital audio signal will now be described in accordance with the subject of the present invention in connection with FIGS. 5*a*, 5*b* and 5*c*.

Figure 5A:
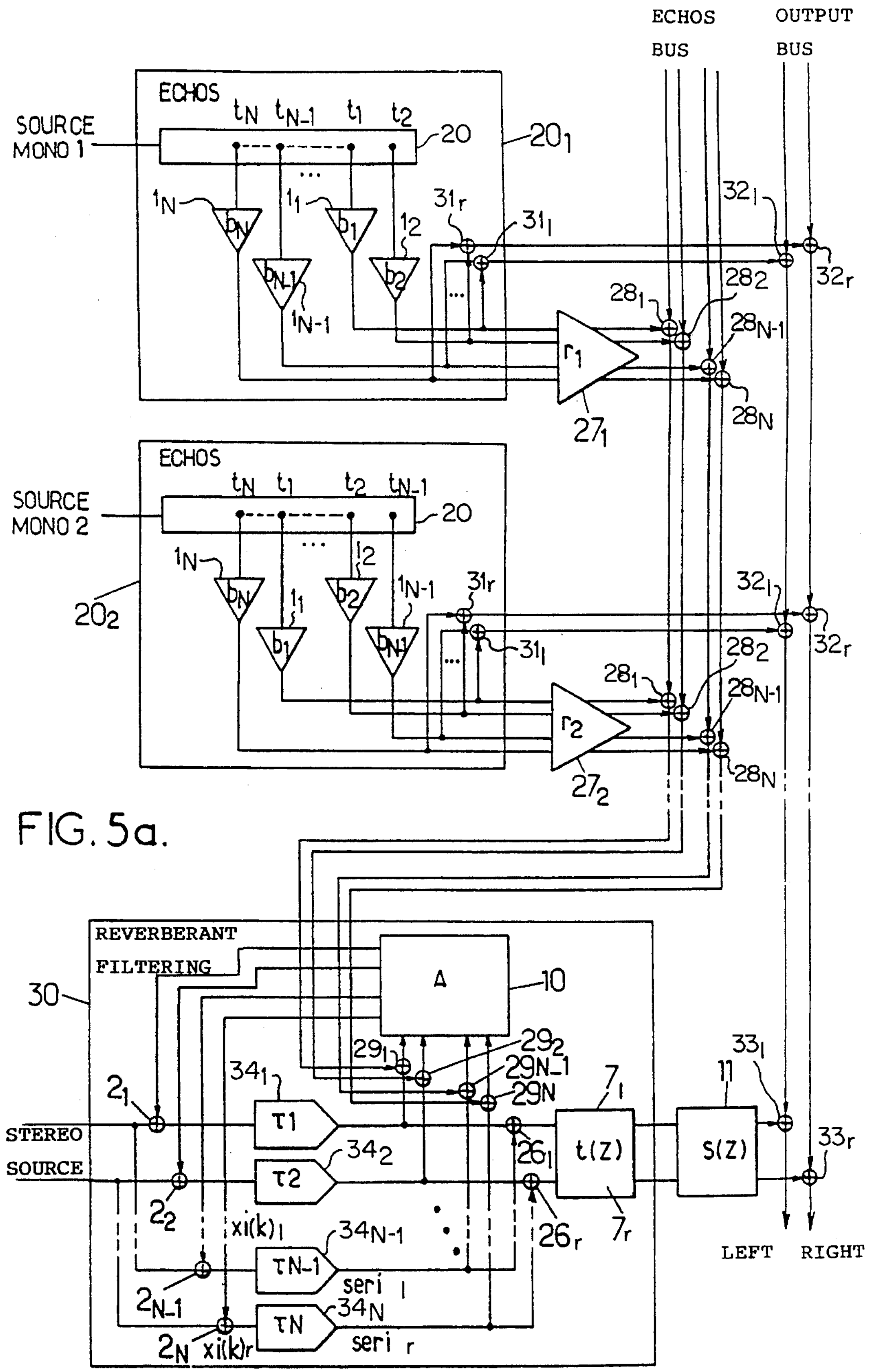
FIG. 5*a* represents the structure of a system according to the subject of the present invention, such as represented in FIG. 4, more particularly of a reverberant filter for recording or transmitting a stereophonic digital audio signal, allowing the simultaneous spatial processing of several monophonic sources.
Figure 6A:
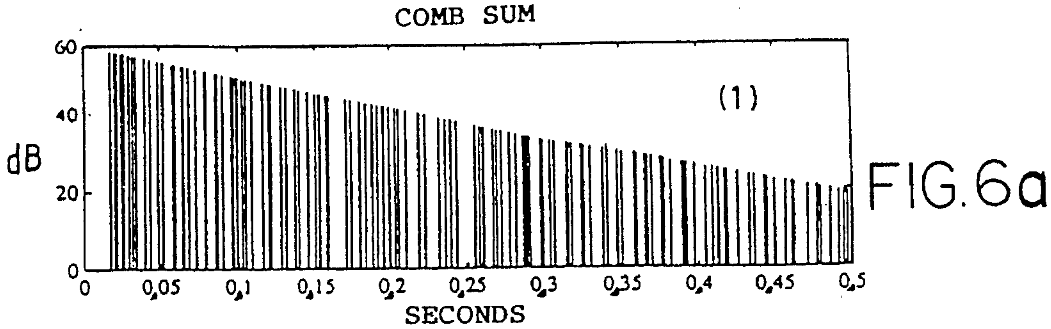
Figure 6B:
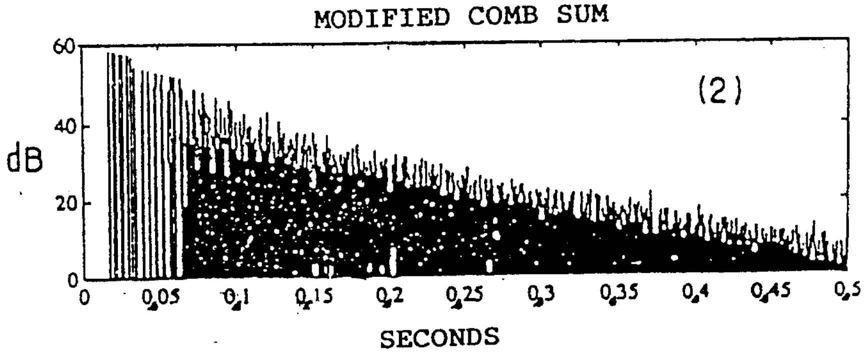
Figure 6C:
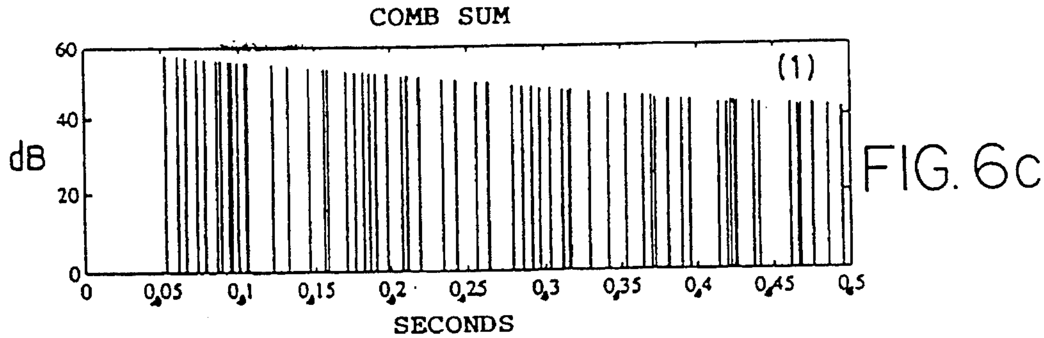
Figure 6D:
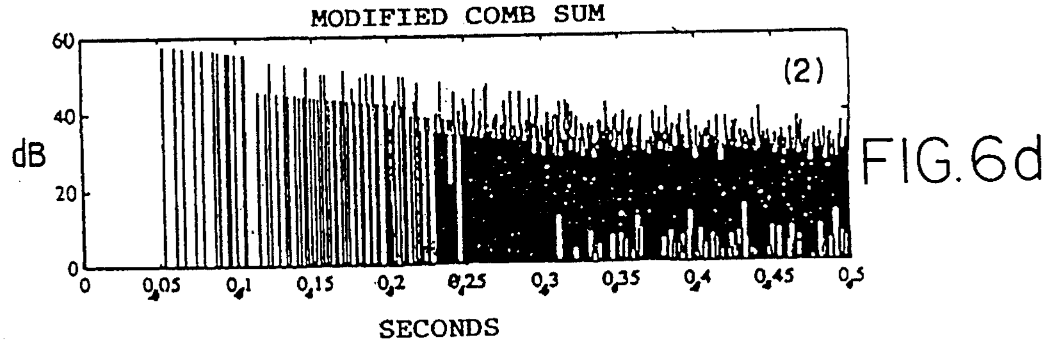

In particular, in the case of FIG. 5*a*, the embodiment presented makes it impossible in fact to ensure control of the clarity and direction of origins of the early echoes for each monophonic source, which, of course in a non-limiting manner, may go to make up sources of a recording or a transmission of a stereophonic recording. In the latter case, the device which is the subject of the present invention such as represented in FIG. 5*a* then makes it possible to control the clarity and direction of origin of the echoes associated with each corresponding monophonic source, in such a way as to simulate a situation where the sources are at different positions in the same room.

As will be observed on looking at FIG. 5*a*, the system which is the subject of the present invention then comprises essentially a reverberant filter proper 30, which has been represented in a purely illustrative manner identical to that of FIG. 4, and one or more modules for processing the first echoes, these modules for processing the first echoes being labelled $\mathbf{20_1}$, $\mathbf{20_2}$ and each relating to a first source mono 1 respectively second source mono 2, for example. Of course a plurality of monophonic sources can be used. It will be noted that, in a manner identical to the embodiment of FIG. 4, each module for processing the first echoes comprises a delayer element 201 of the instants of arrival ti, to constitute the signals of first echoes. This delayer element can be produced, either by means of a digital delay circuit, or more simply by means of a sequentially addressable random-access memory system, the stored input samples of the digital audio signal x(k) being read successively by shifting the delay for shifting the instants of arrival ti. The shifted elementary signals forming the corresponding order 1 echoes for the signals mono 1, mono 2, are next weighted by the multiplier coefficients bi of the corresponding multiplier elements **1*i*, and these signals, after adjustment by way of a multiplier element $\mathbf{27_1}$, respectively $\mathbf{27_2}$, applying an identical gain r1, respectively r2, to each elementary signal, are injected onto an echo BUS, which allows the injection of the first corresponding echoes at the level of the input of the feedback matrix 10 of the reverberant filter proper 30. It will be noted that the corresponding signals of first echoes are injected onto the echo BUS by way of summing elements 28*i* of conventional type, and then at the level of the input of the matrix 10 of the reverberant filter proper, by summing elements denoted 29*i* in FIG. 5*a*. The output bus receives a left and a right signal via summing elements 31*r*, 31*l* and 32*r* or 32*l***.

As regards the reverberant filter proper, 30, the latter receives as input a left, respectively right, stereo source signal, transmitted on a left pathway and on a right pathway. It will be noted that the reverberant filter proper 30 of FIG. **5*a* is configured so that the latter comprises a plurality of N delay pathways, distributed as N/2 delay pathways relating to the left pathway, and making it possible to create in succession N/2 left elementary signals, denoted xi(k)l), then in a manner similar to the reverberant filter represented in FIGS. 3*a* or 4, N/2 left delayed elementary signals, seril. The reverberant filter proper 30 of FIG. 5*a* also comprises N/2 delay pathways relating to the right pathway, and making it possible to create in succession likewise N/2 right elementary signals, xi(k)r, then naturally N/2 right delayed elementary signals, serir. Furthermore, summing elements 26*r* for the N/2 right delayed elementary signals, serir, and respectively left 26*l* for the left delayed elementary signals, serig, are provided in order to effect the respective summations of these signals, these aforesaid summing elements being followed by a right, respectively left spectral correction module, and by a left and right low-pass filtering module. The right and left spectral correction module is denoted 7*r*, respectively 7*l*, and can be made up in the same manner as in the case of FIGS. 3*a* and 4**.

It will be noted that the output signal from the reverberant filter proper, that is to say output by the spectral response corrector element **7*l* or 7*r*, possesses a flat spectral envelope which can be corrected by a filter whose response is that of a low-pass filtering module, for the left and right pathways. The corresponding low-pass filter with transfer function s(z) is denoted 11 and is evidently connected to an output BUS making via summing elements 33*r*, 33 *l*** it possible to listen to or record the corresponding stereophonic spatially processed digital audio signal.

It will furthermore be noted as represented in FIG. **5*a* that the signals of the first echoes delivered by the modules for first echoes $\mathbf{20_1}$ or $\mathbf{20_2}$ are likewise injected directly onto the output BUS, independently of the signal emanating from the reverberant filter so as to allow the control of the clarity for each source MONOi by virtue of the values of gain ri of the multiplier elements 27*i***.

Generally, it will be noted that the system which is the subject of the present invention such as represented in FIG. **5*a* allows control of the direction of origins of the early echoes, produced by grouping the echoes at the level of the control system, not shown in FIG. 5*a*, in left and right echo pairs. If the number N of delays of the reverberant filter proper 30** is even, each echo module synthesises N/2 stereophonic echoes whose amplitude, moment of arrival and direction of origin are controlled. The direction of origin of each echo is defined by the time and energy deviation between the left and right channels.

For stereophonic headset listening, for example, the method which is the subject of the present invention such as illustrated in FIG. **5*a***, makes it possible to attribute to each early echo any direction of origin in the upper vertical half-plane delimited by the axis of the ears, whilst for listening by loudspeaker in the conventional stereophonic arrangement, tests have confirmed that the method according to the invention makes it possible on the contrary to simulate all the direction of origins in the front horizontal half-plane delimited by this same axis, on condition that use is made of a compensation system for the sound path from each loudspeaker to the opposite ear.

In FIG. **5*a***, the first echo assigned to each source plays the role of a direct sound for this source.

In FIG. **5*b* has been represented a particular embodiment of a reverberant filter proper 30 in a stereophonic application in the case where the reverberant filter proper corresponds to the embodiment of the feedback of FIG. 3*b*, this reverberant filter corresponding as a subdivision of the N delay pathways for taking account of the left and right pathways of the stereophonic emission. In FIG. 5*b* it will be noted that the various elements doubled up as a function of the parity of the rank of the delay pathway bear the indices 2p-1 for delay pathways of odd rank and 2p for the delay pathways of even rank. The summing element 22 of FIG. 3*b* is replaced by a summing element for the right, respectively left pathway, bearing the labels 25*r* and 25*i*. The summing element $\mathbf{6_1}$ of FIG. 3*b* is replaced by the corresponding summing elements 26*r* and 26*l* for the right and left pathways. Finally, it will be noted that multiplier elements for adjusting gain g bear the label $\mathbf{24_r}$, 24*l***, these elements allowing adjustment of the corresponding gain, so as to avoid any possible saturation phenomena.

In FIG. **5*c* has been represented the system which is the subject of the present invention in which the feedback loop of the reverberant filter proper 30 is produced, for example, as represented in FIG. 3*c*, the subdivision between delay pathway, Vi, of even, respectively odd rank, that is to say at the level of the output of each corresponding absorbent delay of even or odd rank allowing reconstruction of the right, respectively left pathways of the stereophonic output signal. In FIG. 5*c* the stereophonic input signal has not been represented so as not to overburden the drawing, but corresponds substantially to that of FIG. 3*c***.

As regards the practical embodying of a spatial processor system according to the subject of the present invention such as represented for example in a stereophonic application in FIGS. **5*a*, 5*b* or 5*c***, it will be noted that the definition of the properly speaking stereophonic reverberant filter can be carried out in two independent steps:

absorbent delays and corrector filter:

first order IIR type absorbent filter which provides two independent parameters for adjusting the reverberation time.

In this case it can be shown that the spectral balance of the reverberated signal can be maintained by means of the first order FIR type corrector filter t(z) satisfying the relation (2) mentioned previously in the description. A low-pass filtering carried out by the filter 11 makes it possible to improve the realism of the reverberation, this filter being produced by a second order filter. This filter 11 makes it possible to carry out the control of the spectral envelope of the reverberation.

structure of the reference filter: the chosen feedbacks are unit feedbacks such as represented for example in FIGS. 3*b* to 3*e*.

The corresponding reverberant filter is controlled by 4 totally independent parameters: the size of the auditorium defined by a dimension characteristic of the latter, the reverberation time Tr(ω) at low frequencies, the ratio Tr at high frequencies/Tr at low frequencies, and the cut-off frequency of the reverberated signal.

In a practical embodiment, the reverberant filter proper was produced with the aid of digital computation means including a DSP 56000 computer receiving the stereophonic source signal as input and of a computer element of the same type producing the modules for controlling the first echoes of FIG. 5*c*, for example. This second computer element makes it possible to read the signals from several mono sources and transmits the channels of the echo BUS to the reverberant filter. It will be noted that even if the number of monophonic sources is greater, four echo modules are sufficient for realistic spatial processing. It will be noted that the monophonic sources are then distributed as four groups each of which is attributed to one echo module.

As far as the definition and embodying of the corrector filter with transfer function t(z) and of the absorbent filter with transfer function hi(z) are concerned, they, in accordance with the subject of the present invention, can be produced as represented in FIG. 5*d*.

As shown in FIG. 5*d*, corrector element 7 and absorbent delay element 34 include elements 35, 38–41 and 38, 42–25, respectively. The various parameters used by these elements satisfy the relations:

$$hi(z) = ki \cdot \delta ki(z) \text{ where } \delta ki(z) = \frac{1-\beta i}{1-\beta i \cdot z^{-1}} \quad (10)$$

$$Ki = 20 \cdot \log_{10}(ki) \quad (11)$$

$$Ki = -60 \cdot \tau i/Tr(0) \text{ where } \tau i = mi \cdot T \quad (12)$$

$$\beta i = Ki \cdot \frac{\ln(10)}{40} \cdot \left(1 - \frac{1}{\alpha}\right) \text{ where } \alpha = \frac{Tr(\pi)}{Tr(0)} \quad (13)$$

$$t(z) = g \cdot \frac{1-\beta \cdot z^{-1}}{1-\beta} \text{ with } g\sqrt{\frac{\Sigma \tau i}{Tr(0)}} \quad (14)$$

$$\beta = \frac{1-\sqrt{\alpha}}{1+\sqrt{\alpha}} \text{ with } \alpha = \frac{Tr(\pi)}{Tr(0)} \quad (15)$$

$$\beta i = 1 - \frac{2}{1 + ki(^{1-1/\alpha})} \text{ with } \alpha = \frac{Tr(\pi)}{Tr(0)} \quad (16)$$

Relation 13 in fact constitutes an approximation to relation 16.

In FIGS. 6*a*, 6*b*, 6*c* and 6*d* represent respectively the echograms of mono reverberant filters simulating a room of average size, that is to say for N=8 delay pathways, when using a prior art comb sum structure; when using a reverberant filter such as represented in FIG. 3*e*; mono reverberant filter echograms simulating a room of large size N=12 delay pathways, relating to a prior art comb sum structure; relating to the reverberant filter structure of FIG. 3*b*.

It can in particular be observed that the family of reverberant filters which make up the systems for spatialising a digital audio signal which is the subject of the present invention considerably improves the quality of reverberation by comparison with the known so-called comb sum structure. It makes it possible in particular rapidly to obtain a high density of echoes in the temporal response for a number N of reduced delays. In practice, in order to simulate the reverberation of a typical room with a reverberation time of the order of one second, 8 delays are sufficient, that is to say 8 delay pathways, where 40 comb filters would be required. The simulation of a room of large size requires that the modal density, hence the sum of the durations of the absorbent delays τi, be of the order of one second. It is then judicious to take the number of delays to 12 at least, so as to increase the echo density at the start of the temporal response.

It will finally be noted that the real-time simulation of the reverberation in all cases can be carried out by means of the computational capacity of a DSP 56000 microcomputer and that in particular this type of computer makes it possible, in the case of the simultaneous spatial processing of several monophonic sources, to process 4 monophonic sources if the number of channels of the echo BUS is 12. This embodiment makes it possible for example to control separately for each source the amplitude, the instant of arrival and the direction of origin of the direct sound and of the five first reflections. Of course, it is possible to lengthen the echo BUS so as to process other sources by means of another additional computer of the same type. Thus, for a 16-channel echo BUS, the use of three computers of DSP 56000 type makes it possible to spatialise 6 monophonic sources while controlling, for each, the first 8 echoes.

Figure 7A:
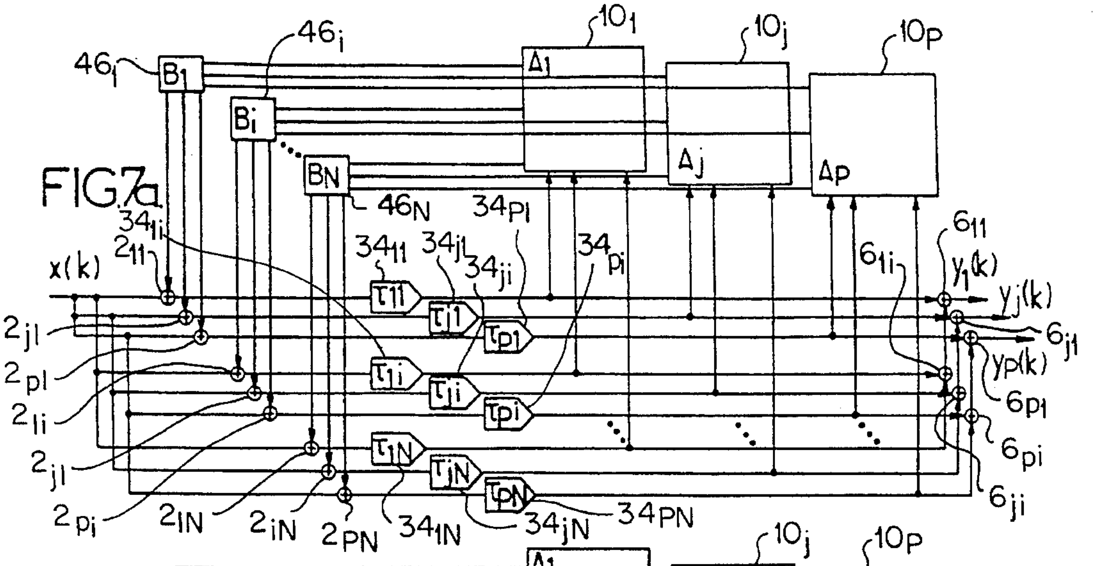
FIGS. 7*a*, 7*b*, 7*c* represent an embodiment of a system according to the subject of the present invention in which a plurality of P reverberant filters are used in parallel, an interlacing of the feedbacks thus produced being furthermore produced by means of a plurality of N unit matrices of dimension P×P.
Figure 7B:
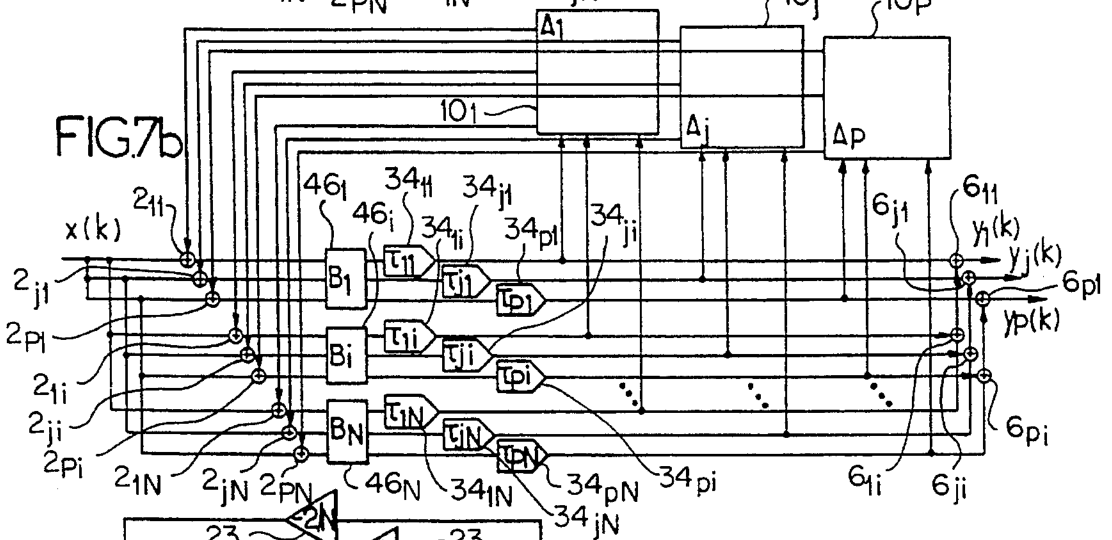
Figure 7C:
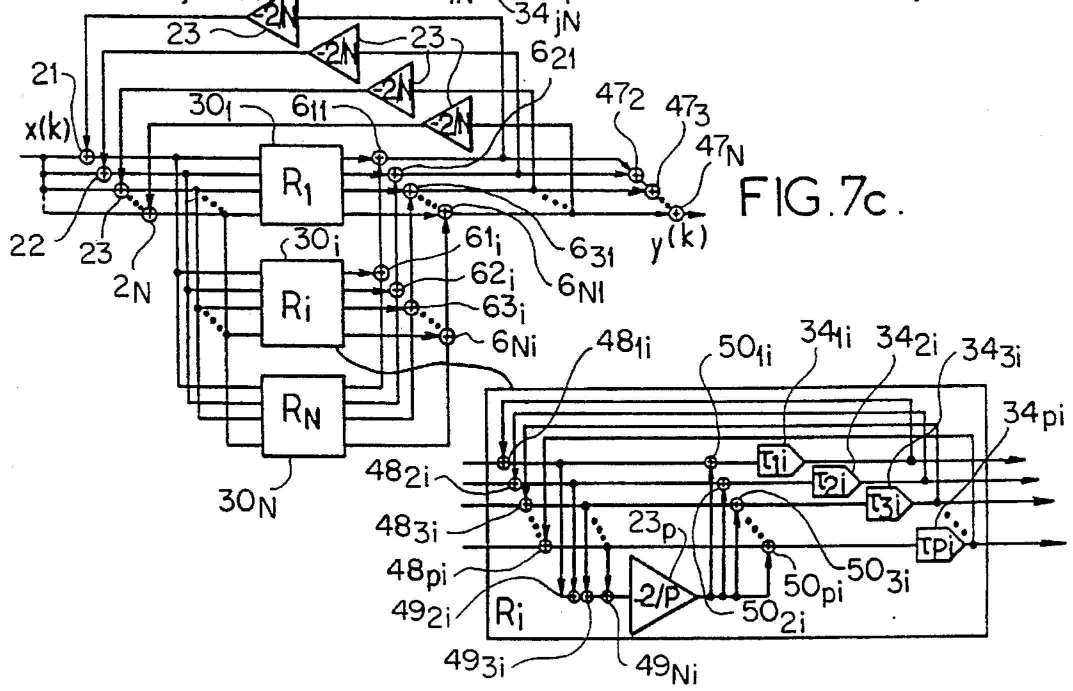

A particularly advantageous use of a system which is the subject of the present invention will now be described in connection with FIGS. 7*a*, 7*b* and 7*c*.

In the feedback matrices defined by relation (8), the absolute values of the coefficients aji can take only two absolute values. Indeed, N of them have the absolute value 1−(2/N), and all the others have the absolute value 2/N. Consequently, when the number N of delays becomes large, a small number of feedback paths predominates with respect to the others. This has the effect of delaying the point in time at which, in the impulse response, all the echoes have similar amplitudes. It follows from this that the temporal density is perceived as insufficient in the start of the impulse response, although the theoretical echo density is high.

The aforesaid disadvantage can be eliminated while profiting from the advantages, as regards computational cost, offered by the unit matrices defined previously by relation (8), whilst maximizing the temporal density actually perceived onwards from the start of the impulse response. For this purpose, as illustrated by FIGS. 7*a*, 7*b*, when the number of delays is relatively large (equal to at least 12), it is advantageous, according to the invention, to use P reverberant filters in parallel, each comprising N delays, whose unit feedback matrices of dimension N×N are denoted Aj, this configuration thus comprising N.P delays, denoted τji, where j=1 . . . P and i=1 . . . N, to interlace the P feedbacks thus constituted, by means of N unit matrices of dimension P×P, denoted Bi, as represented in FIG. 7*a* and 7*b*, to constitute a single reverberant filter.

It will be observed that the loopback thus produced is identical for these two figures, since the only difference lies in the positioning of the interlacing matrices **46*i*** with respect to the contribution of the input signal x(k), within the feedback of each of the P starting reverberant filters.

In the absence of interlacing, or when all the matrices Bi are equal to the unit matrix $I_P$, the loopback matrix, denoted $A_{PN}$, for the whole can be written:

$$A_{PN} = J_{PN} \cdot \begin{bmatrix} A1 & & & & \\ & A_2 & & & \\ & & \cdot & & \\ & & & \cdot & \\ & & & & \cdot \\ & & & & & A_P \end{bmatrix} \tag{17}$$

$A_{PN}$ is a unit matrix, being the product of a block-diagonal matrix formed by the unit matrices Aj, and of a permutation matrix denoted JPN. This permutation corresponds to exchanging the indices i and j in the numbering of the delays τji, it is such that if all the matrices Aj are equal to the same matrix A, then the matrix $A_{PN}$ can be written:

$$A_{PN} = \begin{bmatrix} a_{11} \cdot I_P & a_{21} \cdot I_P & \ldots & a_{N1} \cdot I_P \\ a_{12} \cdot I_P & a_{22} \cdot I_P & \ldots & a_{N2} \cdot I_P \\ \cdot & \cdot & \cdot & \cdot \\ \cdot & \cdot & \cdot & \cdot \\ \cdot & \cdot & \cdot & \cdot \\ a_{1N} \cdot I_P & a_{2N} \cdot I_P & \ldots & a_{NN} \cdot I_P \end{bmatrix} \tag{18}$$

When the interlacing matrices Bi are present, the feedback matrix of the whole system remains a unit matrix and becomes:

$$\begin{bmatrix} B_1 & & & & \\ & B_2 & & & \\ & & \cdot & & \\ & & & \cdot & \\ & & & & \cdot \\ & & & & & B_N \end{bmatrix} \cdot A_{PN} \tag{19}$$

In the particular case where all the matrices Aj are identical, $AB_{PN}$ can be written:

$$AB_{PN} = \begin{bmatrix} a_{11} \cdot B_1 & a_{21} \cdot B_1 & \ldots & a_{N1} \cdot B_1 \\ a_{12} \cdot B_2 & a_{22} \cdot B_2 & \ldots & a_{N2} \cdot B_2 \\ \cdot & \cdot & \cdot & \cdot \\ \cdot & \cdot & \cdot & \cdot \\ \cdot & \cdot & \cdot & \cdot \\ a_{1N} \cdot B_N & a_{2N} \cdot B_N & \ldots & a_{NN} \cdot B_N \end{bmatrix} \tag{20}$$

The feedback matrix $AB_{PN}$ appears then as a matrix obtained by unit assembling of unit blocks, this feedback matrix $AB_{PN}$ being designated the "block unit matrix".

According to an advantageous embodiment, the latter consists in choosing the matrices Aj and Bi within the family defined by the preceding relation (8). In this case, each of the P feedbacks defined by the matrices Aj can be produced with 2.N operations, and each of the N interlacings defined by the matrices Bi can be produced with 2.P operations, namely a total of 4.N.P operations to produce a reverberant filter comprising N.P delays. This cost is twice that for a production simply using a matrix of dimension (N.P)×(N.P) chosen from the family defined by the aforesaid relation (8), but the choice of a "block unit" matrix leads to feedback coefficients of similar orders of magnitude, thus very substantially improving the temporal density perceived at the start of the impulse response of the single reverberant filter thus produced.

A particularly attractive embodiment, an example of which is described below, is the embodying of a reverberant filter comprising 16 delays, in the case where N=P=4. In this case, relation (8) leads to matrices Aj and Bi which, to within a permutation of rows or columns, are all equal to the matrix:

$$A = \frac{1}{2} \begin{bmatrix} 1 & -1 & -1 & -1 \\ -1 & 1 & -1 & -1 \\ -1 & -1 & 1 & -1 \\ -1 & -1 & -1 & 1 \end{bmatrix} \tag{21}$$

This leads, for the whole system, to a block unit matrix of dimensions 16×16 which is particularly advantageous since all its coefficients have the same absolute value.

As described in FIG. **7*c*, a reverberant filter consisting of N.P delays is obtained, as described previously, by associating in parallel and interlacing the feedbacks of P reverberant filters each consisting of N delays. In this example, the P starting reverberant filters are identical to that of FIG. 3*b* and the interlacing of the P feedbacks is itself produced like the feedback of FIG. 3*b***.

FIG. **7*c* shows that the reverberant filter thus produced can likewise be regarded as the placing in parallel of N reverberant filters 10*i* with P inputs and P outputs, the whole being "fed back" to itself as represented in FIG. 3*b*. Each reverberant filter includes absorbent delay elements 34*pi*, a multiplier 23*p* and summing elements 48*pi*, 49*pi* and 50*pi*. It can be verified in the aforesaid figure that the total number of additions-multiplications required for feeding back and calculating the output signal y(k) delivered by summing elements 47*i*** is approximately equal to 4.N.P In the particular case where N=P=4, the feedback matrices Aj and the interlacing matrices Bi are all equal to the matrix:

$$A = \frac{-1}{2} \begin{bmatrix} - & + & + & + \\ + & - & + & + \\ + & + & - & + \\ + & + & + & - \end{bmatrix} \tag{22}$$

where, for simplicity of expression, the signs + and − signify respectively +1 and −1. The feedback matrix, denoted $AA_{16}$, of the reverberant filter with 16 delays thus produced is a block unit matrix and all its coefficients have the same value.

$$AA_{16} = \frac{-1}{1} \begin{bmatrix} -A & A & A & A \\ A & -A & A & A \\ A & A & -A & -A \\ A & A & A & -A \end{bmatrix} = \tag{23}$$

$$\frac{1}{4} \begin{bmatrix}
+ - - - & - + + + & - + + + & - + + + \\
- + - - & + - + + & + - + + & + - + + \\
- - + - & + + - + & + + - + & + + - + \\
- - - + & + + + - & + + + - & + + + - \\
- + + + & + - - - & - + + + & - + + + \\
+ - + + & - + - - & + - + + & + - + + \\
+ + - + & - - + - & + + - + & + + - + \\
+ + + - & - - - + & + + + - & + + + - \\
- + + + & - + + + & + - - - & - + + + \\
+ - + + & + - + + & - + - - & + - + + \\
+ + - + & + + - + & - - + - & + + - + \\
+ + + - & + + + - & - - - + & + + + - \\
- + + + & - + + + & - + + + & + - - - \\
+ - + + & + - + + & + - + + & - + - - \\
+ + - + & + + - + & + + - + & - - + - \\
+ + + - & + + + - & + + + - & - - - +
\end{bmatrix}$$

A method and a system for real-time artificial spatial processing of a digital audio signal has thus been described which is particularly powerful in so far as the method and the system which are the subjects of the invention enable the user separately to control the frequency-varying reverberation time, the spectral envelope of the response of the room actually simulated, as well as the modal density evincing the size of the simulated room and for each sound source the instant of arrival, the amplitude and the direction of origin of each early echo, as well as the clarity. The particularly powerful character of the method and system which are the subjects of the present invention results in particular from the independence between the control of the aforesaid parameters, this independence being indispensable from the perceptive point of view, but also so as to allow simulation of the spatial processing in an actual room on the basis of measurements made therein.

We claim:

1. System for processing of a digital audio signal x(k) for creating a spatially processed digital audio signal y(k) comprising:

means for delaying a plurality of elementary signals xi(k) of said digital audio signal x(k) with different delay and for delivering a plurality of delayed elementary signals;

means for linearly combining said delayed elementary signals and for delivering a plurality of combined delayed elementary signals;

means for adding a combined delayed elementary signal with one of said elementary signals xi(k), prior to delaying the latter;

means for weighted summation of said delayed elementary signals and said digital audio signal x(k) in order to create said spatially processed audio-digital signal y(k), wherein said linearly combining means and said adding means constitutes a unitary feedback loop, for which said plurality of combined delayed elementary signals possess the same energy as said delayed elementary signals, said system further including, means for attenuating each delayed elementary signal, as an attenuation Hi(ω) function of the audio frequency (ω), said attenuation, expressed in decibels, being proportional to each delay and inversely proportional to reverberation time Tr(ω); and means for spectral correction t(z) of said weighted sum of said attenuated delayed elementary signals, prior to their weighted summation with the audio-digital signal x(k), said spectral correction satisfying the relation:

$$|t(e^{j\omega})|^2 = \frac{\Sigma\tau i}{Tr(\omega)}$$

where τi, defined as the absorbent delay, designates the value of each delay, Στi designates the sum of all the absorbent delays, said system constituting a reverberant filter.

2. System according to claim 1, said delaying means further comprises a plurality of N delay pathways connected in parallel by modules for summing, each delay pathway of rank i including at least in succession, one multiplier module bi, a feedback summing module, a delayer module with delay coefficient mi, an attenuator module with transfer function hi (z), a multiplier module ci;

said system comprising a transfer pathway for said digital audio signal including in cascade a multiplier module d and a second summing module, the output from said second summing module for linking said delay pathways in parallel being connected to said second summing module of said transfer pathway by said spectral correction means t(z); and said weighted summation means further comprising a feedback matrix AN of dimensions N×N, with coefficients aij, a column of the matrix being connected at the output of an attenuator module of specified rank and a row of the matrix being connected to one feedback summing module of corresponding rank of a delay pathway and delivering to the latter module a combined delayed elementary signal, being a linear combination of the delayed elementary signals, $$serci = \sum_{j=1}^{N} aji \cdot serj,$$

said matrix AN satisfying the relation $$AN = JN - \frac{2}{N} \cdot UN^T \cdot UN,$$

in which,

JN is a matrix obtained by permuting the rows or columns of the unit matrix IN of dimension N×N, $UN^T$ is the transposed column vector of the row vector of dimension N, Un=[1, 1 . . . . 1].

3. System according to claim 2, wherein said means for linearly combining, for a plurality of N delayed elementary signals, comprise:

means for reinjection according to a bijective correspondence, at the input of rank i of said delayer means, of a delayed elementary signal of rank j diminished by the sum weighted by the ratio 2/N of the delayed elementary signals.

4. System according to the preceding claim 2, wherein for each of the delay pathways of rank i, the delayer module with delay coefficients mi and attenuator module hi(z) form an absorbent delay module, (τ1), said absorbent delay module (τi) being placed downstream of the feedback summing module of said delay pathway or upstream of the latter module on the input pathway of each combined delayed elementary signal.

5. System according to claim 4, in which each absorbent delay module τi being placed upstream of the summing module of corresponding delay pathway, the said elementary signals xi(k) to the multiplier modules bi by way of a delay module for delaying the temporally shifted instants (ti) of arrival, which enables said shifted elementary signals to be constituted as a plurality of order 1 echoes ahead of the simulated late reverberation, said multiplier coefficients (bi) and said delay module constituting a module for processing the first echoes, which is interconnected with a reverberant filter.

6. System according to claim 1, said system being used for processing a stereophonic digital audio signal transmitted over a left pathway and over a right pathway, wherein:

said means for delaying comprises a plurality of N delay pathways, said N delay pathways being first distributed as N/2 delay pathways relating to said left pathway and allowing creation of N/2 left elementary signals xi(k)l, and then N/2 left delayed elementary signals, and second distributed as N/2 delay pathways relating to the right pathway and allowing creation of N/2 right elementary signals xi(k)r, and N/2 right delayed elementary signals, said linearly combining means comprises a first summing module for summing said N/2 right delayed elementary signals and a second summing module for summing said N/2 left delayed elementary signals, followed respectively by a right and left spectral correction module and by a low-pass filtering module;

said weighted summation means further comprises a feedback matrix of dimensions N×N, N/2 columns of the feedback matrix being connected to the N/2 delay pathways transmitting the N/2 right delayed elementary signals and the other N/2 columns of the feedback matrix being connected to the other N/2 delay pathways transmitting the N/2 left delayed elementary signals, N/2 rows of the feedback matrix each being connected to the first summing module of a delay pathway transmitting the N/2 right elementary signals xi(k) r and the other N/2 rows of the feedback matrix each being connected to the second summing module of a delay pathway transmitting the N/2 left elementary signals xi(k)l, thereby forming a reverberant filter for processing said stereophonic digital audio signal.

7. System for processing a digital audio signal according to claim 1, said system being used to simulate a reverberation phenomenon of a monophonic or stereophonic digital audio signal.

8. System according to claim 7, said system being used for processing a stereophonic digital audio signal and further comprising:

a reverberant filter for said stereophonic digital audio signal;

at least one monophonic source; and a plurality of modules for processing first echoes, said at least one monophonic source being associated with each of said modules for processing said first echoes, each module for processing said first echoes delivering shifted elementary signals at the input of the feedback summing module of each delay pathway of said reverberant filter, right or left, by way of a corresponding BUS type link, thereby controlling clarity and direction of orgins of said first echoes from said at least one monophonic source.

9. System according to claim 7, said system being used for processing a stereophonic digital audio signal comprising for a large number of delays:

P reverberant filters in parallel to produce P feedbacks, each feedback comprising N delays, and a unitary feedback matrix Aj, j ∈{1,P} of dimension N×N, said P reverberant filters thus comprising N×P absorbent delays ∈ji, i ∈{1,N}; and means for interlacing said P feedbacks thus produced by means of N unitary matrices Bi, of dimensions P×P, to form a single reverberant filter, thus enabling perceived temporal density of echoes to be increased at the start of impulse response of the said single reverberant filter.

10. Method of processing a digital audio signal x(k) in order to create a spatially processed digital audio signal y(k), comprising the steps of:

duplicating said digital audio signal, into elementary signals xi(k);

subjecting said elementary signals to a plurality of different delays in order to create a plurality of delayed elementary signals seri;

linearly combining said delayed elementary signals in order to obtain a plurality of combined delayed elementary signals serci;

adding at least one of said combined delayed elementary signals to at least one elementary signal xi(k) prior to delaying the latter, said linear combining and said adding forming a feedback loop;

subjecting at least one of said delayed elementary signals seri to a weighted summation with said digital audio signal x(k) in order to create said spatially processed digital audio signal y(k); and simulating a late reverberation phenomenon, including: feeding back said linear combining through a unitary feedback loop, for which said plurality of said combined delayed elementary signals serci possess the same energy as said delayed elementary signals seri;

with each different delay, attenuating said delayed elementary signal seri, said attenuating being dependent on the audio frequency (ω), this attenuation, expressed in decibels, being inversely proportional to reverberation time Tr(ω) and proportional to each delay;

before said weighted summation of said delayed elementary signals with said digital audio signal x(k), correcting said delayed elementary signals with a spectral corrector t(z) satisfying the relation:

$$|t(e^{j\omega})|^2 = \frac{\Sigma\tau i}{Tr(\omega)}$$

τi, defined as the absorbent delay, designates the value of each delay, Στi designating the sum of all the absorbent delays.

11. Method according to claim 10, further comprising a step controlling the instants of arrival and amplitudes of early echoes without engendering any phenomenon of colouration of the reverberated signal, said controlling step comprising:

temporally shifting said instants of arrival t1, . . . ,ti, . . . ,tN at the level of said elementary signals; and choosing a deviation in shift, between the largest and smallest of said instants of arrival, less than the smallest value of said absorbent delays, τi, so as to constitute said shifted elementary signals as a plurality of order 1 echoes ahead of the simulated late reverberation.

12. Method according to claim 11, further comprising simultaneous spatialisation of several monophonic sources in a stereophonic transmission, which is subjected to the method of spatialisation and to a simulated reverberation procedure, the latter comprising:

subjecting each monophonic signal to a procedure of temporal shifting of the instants of arrival of this signal, in order to create a plurality of N shifted elementary monophonic signals, so as to constitute said shifted elementary monophonic signals as a plurality of corresponding order 1 echoes; and injecting, into the feedback applied to stereophonic signals subjected to said simulated reverberation procedure, by summation before feedback with said delayed elementary signals, said shifted elementary monophonic signals.

13. Method according to claim 10, in which said unitary feedback satisfies the relation:

$$AN = JN - \frac{2}{N} \cdot UN^T \cdot UN$$

where AN is the feedback matrix of dimension N×N with transfer coefficients aij, JN is a matrix obtained by permuting the rows or columns of the unit matrix IN of dimension N×N, $UN^T$ is the transposed column vector of the row vector UN of dimensions N, UN=[1, 1. . . , 1].

14. Method according to claim 13, in which the said unitary feedback, for a plurality of N delayed elementary signals, consists in reinjecting, according to a bijective correspondence, at the input of each delay of a delayed elementary signal of rank i a delayed elementary signal of rank j, diminished by the sum, weighted by the ratio 2/N, of the delayed elementary signals.

* * * * *